(12) United States Patent
    Naito

(10) Patent No.: US 10,749,025 B2
(45) Date of Patent: Aug. 18, 2020

(54) SEMICONDUCTOR DEVICE AND MANUFACTURING METHOD THEREOF

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/114,174

(22) Filed: Aug. 27, 2018

(65) Prior Publication Data
    US 2018/0374948 A1    Dec. 27, 2018

Related U.S. Application Data

(63) Continuation of application No. PCT/JP2017/033361, filed on Sep. 14, 2017.

(30) Foreign Application Priority Data

Sep. 14, 2016  (JP) .................................. 2016-180025
Aug. 9, 2017   (JP) .................................. 2017-154304

(51) Int. Cl.
    *H01L 29/78*    (2006.01)
    *H01L 29/739*   (2006.01)
    (Continued)

(52) U.S. Cl.
    CPC ...... *H01L 29/7813* (2013.01); *H01L 29/0696* (2013.01); *H01L 29/083* (2013.01);
    (Continued)

(58) Field of Classification Search
    CPC ............. H01L 29/7813; H01L 29/1095; H01L 29/66545; H01L 29/868; H01L 29/861; H01L 29/78; H01L 29/739
    See application file for complete search history.

(56) References Cited

U.S. PATENT DOCUMENTS 6,031,265 A      2/2000 Hshieh
7,423,316 B2 *   9/2008 Kawaji ............... H01L 29/0696
                                                      257/330
(Continued)

FOREIGN PATENT DOCUMENTS

JP    H06310727 A    11/1994
JP    H11345969 A    12/1999
(Continued)

OTHER PUBLICATIONS

International Search Report for International Patent Application No. PCT/JP20171033361, issued by the Japan Patent Office dated Nov. 7, 2017.
(Continued)

*Primary Examiner* — Syed I Gheyas

(57) ABSTRACT

A semiconductor device having a contact trench is provided. The semiconductor device including: a semiconductor substrate; a drift region of the first conductivity type provided on an upper surface side of the semiconductor substrate; a base region of the second conductivity type provided above the drift region; a source region of the first conductivity type provided above the base region; two or more trench portions provided penetrating through the source region and the base region from an upper end side of the source region; a contact trench provided in direct contact with the source region between adjacent trench portions; and a contact layer of the second conductivity type provided below the contact trench, is provided. A peak of a doping concentration of the contact layer is positioned shallower than a position of a lower end of the source region.

25 Claims, 21 Drawing Sheets

(51) Int. Cl.
*H01L 29/06* (2006.01)
*H01L 29/417* (2006.01)
*H01L 29/08* (2006.01)
*H01L 29/861* (2006.01)
*H01L 29/66* (2006.01)
*H01L 29/40* (2006.01)
*H01L 29/45* (2006.01)
*H01L 29/10* (2006.01)
*H01L 29/868* (2006.01)

(52) U.S. Cl.
CPC ...... *H01L 29/0834* (2013.01); *H01L 29/1095* (2013.01); *H01L 29/407* (2013.01); *H01L 29/417* (2013.01); *H01L 29/456* (2013.01); *H01L 29/66348* (2013.01); *H01L 29/66545* (2013.01); *H01L 29/739* (2013.01); *H01L 29/7396* (2013.01); *H01L 29/7397* (2013.01); *H01L 29/861* (2013.01); *H01L 29/868* (2013.01)

(56) References Cited

U.S. PATENT DOCUMENTS

| | | | |
|---|---|---|---|
| 2003/0096480 A1 | 5/2003 | Hshieh et al. | |
| 2007/0262390 A1* | 11/2007 | Ishida | H01L 27/088 257/368 |
| 2007/0267663 A1 | 11/2007 | Harada | |
| 2008/0067542 A1 | 3/2008 | Tanaka et al. | |
| 2010/0013010 A1 | 1/2010 | Akiyama | |
| 2011/0006362 A1* | 1/2011 | Hsieh | H01L 29/1095 257/330 |
| 2011/0012195 A1* | 1/2011 | Momota | H01L 29/7395 257/334 |
| 2012/0025874 A1* | 2/2012 | Saikaku | H01L 29/66727 327/109 |
| 2012/0214281 A1* | 8/2012 | Tomita | H01L 29/6634 438/138 |
| 2012/0319136 A1* | 12/2012 | Noborio | H01L 29/1095 257/77 |
| 2013/0001638 A1* | 1/2013 | Yoshikawa | H01L 29/0696 257/139 |
| 2013/0069146 A1 | 3/2013 | Okumura et al. | |
| 2013/0082301 A1 | 4/2013 | Onozawa et al. | |
| 2015/0060937 A1 | 3/2015 | Hikasa | |
| 2015/0372090 A1 | 12/2015 | Oosawa et al. | |

FOREIGN PATENT DOCUMENTS

| | | |
|---|---|---|
| JP | 2005536868 A | 12/2005 |
| JP | 2006032676 A | 2/2006 |
| JP | 2007311627 A | 11/2007 |
| JP | 2010027719 A | 2/2010 |
| JP | 2012174989 A | 9/2012 |
| JP | 2013065724 A | 4/2013 |
| JP | 2014030050 A | 2/2014 |
| JP | 2014158013 A | 8/2014 |
| JP | 2014212358 A | 11/2014 |
| JP | 2015065420 A | 4/2015 |
| JP | 2015213193 A | 11/2015 |
| WO | 2012124784 A1 | 9/2012 |

OTHER PUBLICATIONS

Office Action issued for counterpart Japanese Application No. 2018-539793, issued by the Japanese Patent Office dated Dec. 3, 2019 (drafted on Nov. 27, 2019).

* cited by examiner

SEMICONDUCTOR DEVICE AND MANUFACTURING METHOD THEREOF

The contents of the following Japanese patent application(s) are incorporated herein by reference:
NO. 2016-180025 filed in JP on Sep. 14, 2016,
NO. 2017-154304 filed in JP on Aug. 9, 2017, and
NO. PCT/JP2017/033361 filed on Sep. 14, 2017.

BACKGROUND

1. Technical Field

The present invention relates to a semiconductor device and a manufacturing method thereof.

2. Related Art

Conventionally, a semiconductor device having two or more trench portions is known to have a contact trench between adjacent trench portions, and a P+ type contact layer below the contact trench (refer to Patent Documents 1 and 2, for example).

Patent Document 1: Japanese Patent Application, Publication No. 2015-213193.
Patent Document 2: Japanese Patent Application, Publication No. 2015-065420.

However, as a conventional semiconductor device is miniaturized and a mesa width is narrowed, a P+ type contact layer may affect a threshold voltage Vth.

SUMMARY

[General Disclosure]

Provided in the first aspect of the present invention is a semiconductor device including: a semiconductor substrate; a drift region of the first conductivity type provided on an upper surface side of the semiconductor substrate; a base region of the second conductivity type provided above the drift region; a source region of the first conductivity type provided above the base region; two or more trench portions provided penetrating through the source region and the base region from an upper end side of the source region; a contact trench provided in direct contact with the source region between adjacent trench portions; and a contact layer of the second conductivity type provided below the contact trench. A peak of a doping concentration of the contact layer is positioned shallower than a position of a lower end of the source region.

The contact layer may have a plurality of peaks of a doping concentration.

The peak position may be a peak position of a peak having the maximum doping concentration among the plurality of peaks.

The lower end of the source region may be positioned deeper than a position of a lower end of the contact trench.

Each of the two or more trench portions may have a trench conductive portion. The lower end of the source region may be positioned deeper than a position of an upper end of the trench conductive portion.

The lower end of the source region may have a width from 10% to 30% inclusive of a mesa width between the two or more trench portions, in an arrangement direction of the trench portions.

The source region may be provided extending in an extending direction of the trench portions.

A contact region of the second conductivity type provided above the base region may be further included. Source regions and contact regions may be alternately provided in the extending direction of the trench portions.

Contact layers may be provided extending in the extending direction of the two or more trench portions.

The contact layers may be provided on at least parts of side walls of contact trenches.

Lower ends of the contact layers may be positioned deeper than positions of lower ends of the source regions.

A thickness of a contact layer in a depth direction may be from 0.1 μm to 1.0 μm inclusive.

A lower end of the contact layer may be positioned shallower than a position half the thickness of the base region.

The lower end of the contact layer may be at position as deep as a position of the lower end of the base region.

An upper end of the contact layer may be positioned shallower than the position of the lower end of the source region.

A width of the lower end of the contact layer may be narrower than a width of the upper end of the contact layer in the arrangement direction of the trench portions.

Below the contact trench, a doping concentration of the contact layer may be larger than a doping concentration of a source region at the same depth.

The lower end of the contact trench may have a width from 0.1 μm to 0.4 μm inclusive in the arrangement direction of the trench portions.

The contact trench may be tapered.

The semiconductor device may further include the second contact layer of the second conductivity type provided below the first contact layer.

An accumulation region of the first conductivity type provided between the drift region and the base region may be further included. The accumulation region has a concentration higher than a concentration of the drift region.

The contact layer may be in direct contact with the accumulation region.

The lower end of the contact layer may be provided at a position deeper than half the distance between an upper end of the accumulation region and the lower end of the source region.

The semiconductor device may further include the second accumulation region of the first conductivity type formed at a position deeper than a position of the first accumulation region. The second accumulation region has a doping concentration higher than a doping concentration of the drift region.

Provided in the second aspect of the present invention is a manufacturing method of a semiconductor device including: forming a drift region of the first conductivity type, a base region of the second conductivity type, a source region of the first conductivity type, two or more trench portions penetrating through the source region and the base region, on an upper surface side of a semiconductor substrate; forming a contact trench between two trench portions so as to be in direct contact with the source region; and forming a contact layer of the second conductivity type by implanting a dopant below the base region from a lower end of the contact trench, such that a peak of a doping concentration is positioned shallower than a position of a lower end of the source region, in a region facing the lower end of the contact trench.

Forming the contact layer may include implanting the first dopant and implanting the second dopant.

Forming the source region may include forming the source region in the entire surface of the base region, and forming the contact trench may include forming the contact trench between the two trench portions inside the source region formed in the entire surface of the base region.

Note that, the summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention. However, the following embodiments shall not limit the claimed invention. Also, not all combinations of features described in the embodiments are essential for means to solve problems provided by aspects of the invention.

Example 1

Figure 1A:
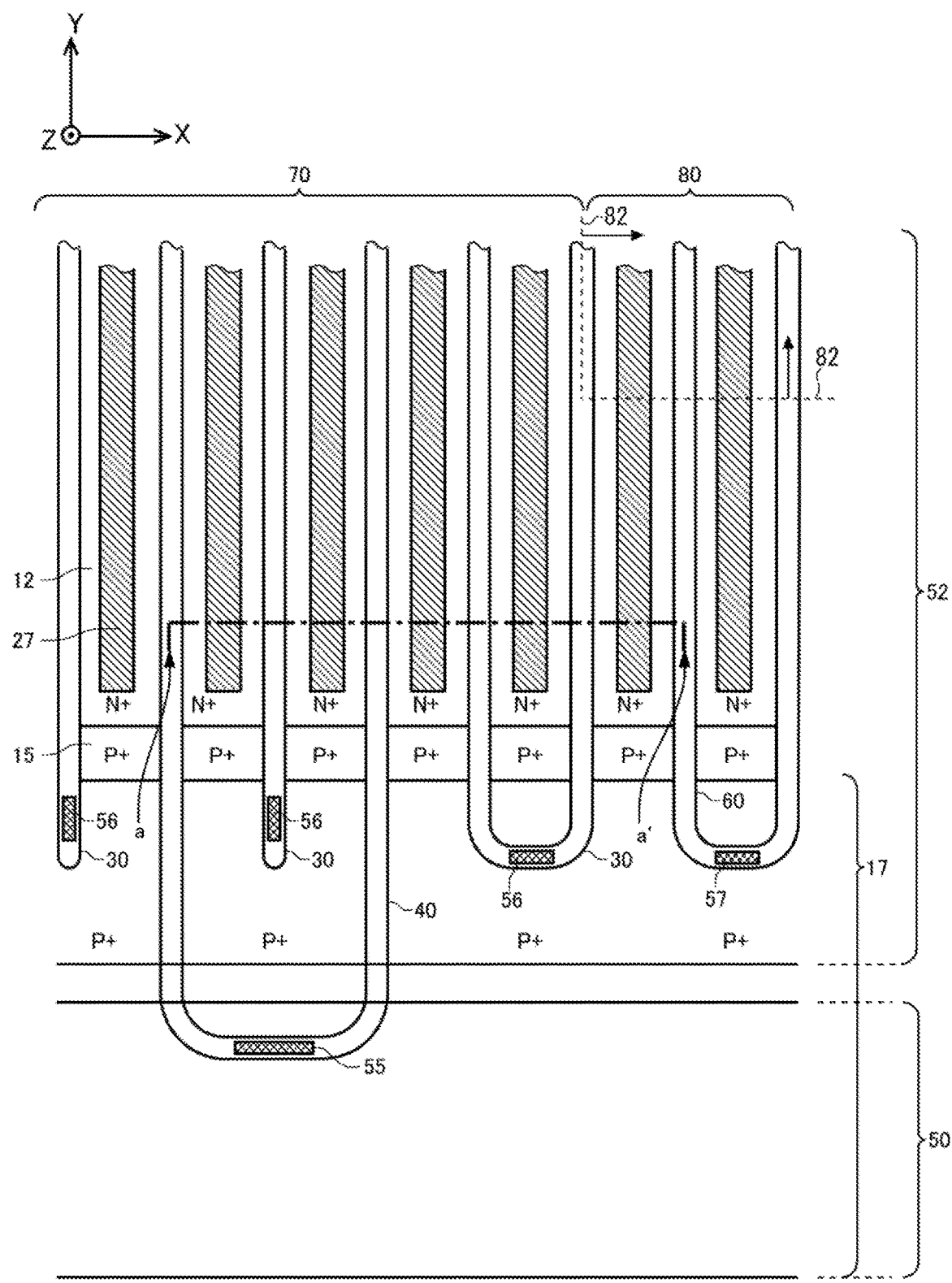
FIG. 1A is a plan view illustrating one example of a semiconductor device 100 according to Example 1.
Figure 1B:
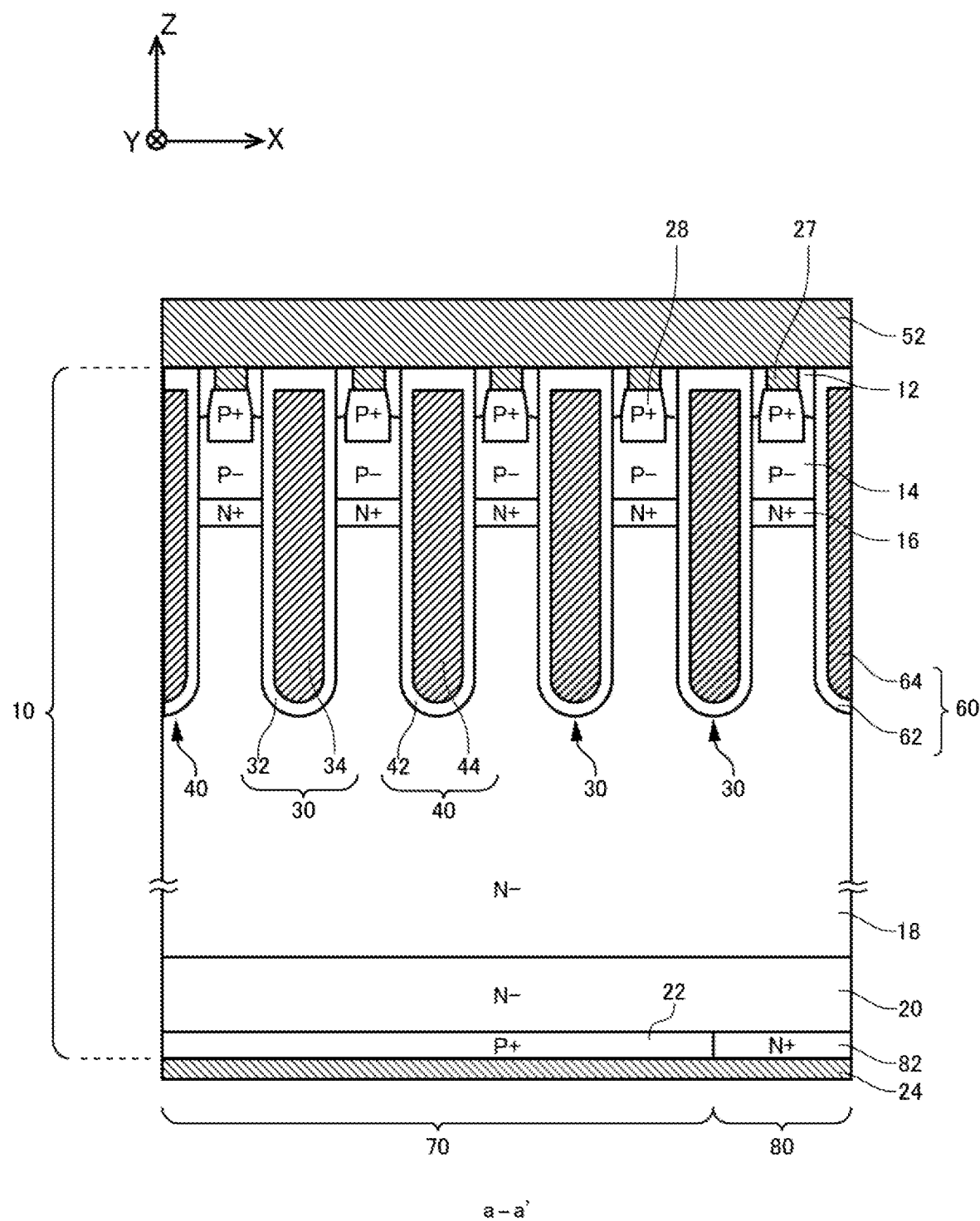
FIG. 1B illustrates one example of the cross-section a-a' of the semiconductor device 100 according to Example 1.

FIG. 1A is a plan view illustrating one example of a semiconductor device 100 according to Example 1. FIG. 1B illustrates one example of the cross-section a-a' of the semiconductor device 100 according to Example 1. The semiconductor device 100 of the present example is a semiconductor chip having a transistor portion 70 including a transistor such as an IGBT (Insulated Gate Bipolar Transistor), and a diode portion 80 including a diode such as a FWD (Free Wheel Diode). In FIG. 1A, a chip surface in the vicinity of a chip end portion is shown and other regions are omitted.

Note that, in the present specification, one side is referred to as "upper", and the other side is referred to as "lower" in a direction parallel to a depth direction of a semiconductor substrate 10. The phrases "upper" and "lower" may not be limited by directions of the gravity direction. A direction connecting an emitter electrode and a collector electrode is referred to as a depth direction. Also, in each embodiment, an example is shown in which the first conductivity type and the second conductivity type are of an N type and a P type respectively. However, conductivity types of a substrate, layer, region, or the like may be of inverse polarity respectively.

The semiconductor device 100 of the present example has source regions 12, contact regions 15, a well region 17, contact trenches 27, dummy trench portions 30, gate trench portions 40, a gate metal layer 50, an emitter electrode 52, contact holes 55, 56, and 57, and emitter trench portions 60, on a chip upper surface side. Note that, in the present specification, if simply calling trench portions, they refer to the dummy trench portions 30, the gate trench portions 40, and the emitter trench portions 60.

The semiconductor substrate 10 is a substrate formed of a silicon semiconductor or the like. The semiconductor substrate 10 may also be formed of a compound semiconductor such as a silicon carbide semiconductor or a gallium nitride semiconductor. The semiconductor substrate 10 of the present example is of an N+ type. The semiconductor substrate 10 includes source regions 12, base regions 14, contact regions 15, accumulation regions 16, a well region 17, a drift region 18, a buffer region 20, a collector region 22, and a cathode region 82. Also, the gate metal layer 50 and the emitter electrode 52 are formed on the upper surface, and a collector electrode 24 is formed on the lower surface, of the semiconductor substrate 10. An interlayer dielectric film is formed between the emitter electrode 52 and the gate metal layer 50, and the upper surface of the semiconductor substrate 10. However, it is omitted from the drawing of the present example.

The drift region 18 is formed on the upper surface side of the semiconductor substrate 10. The upper surface side of the semiconductor substrate 10 may refer to above the upper surface of the semiconductor substrate 10, or may refer to the vicinity of the upper surface inside the semiconductor substrate 10. The drift region 18 is formed on back surface sides of the accumulation regions 16. The drift region 18 of the present example is of an N− type.

The base regions 14 are formed above the drift region 18. The base regions 14 may be formed by implanting dopants from the upper surface side of the drift region 18. The base regions 14 are respectively formed in mesa portions sandwiched by the trench portions. The mesa portions refer to regions between adjacent trench portions. The base regions 14 have doping concentrations lower than a doping concentration of the well region 17. The base regions 14 of the present example are of P− types.

The source regions 12 are formed above the base regions 14. Also, the source regions 12 are formed extending in extending directions of the trench portions. The source regions 12 of the present example are formed in mesa portions between two adjacent trench portions among a plurality of trench portions. The source regions 12 may be formed by implanting dopants from the upper surface sides of the base regions 14. The source regions 12 of the present example are of N+ types. Note that, in the present specification, the Y axis direction is an extending direction of a trench portion, and the X axis direction is an arrangement direction of the trench portion. The Z axis direction is a depth direction of the semiconductor device 100.

The contact trenches 27 are formed on the upper surface side of the semiconductor substrate 10. The contact trenches 27 are formed between adjacent trench portions, and provided in direct contact with the source regions 12. In one example, the contact trenches 27 are formed by etching the source regions 12. Conductive materials may be embedded in the contact trenches 27 in the same process as a process of embedding conductive materials to the emitter electrode 52.

Contact layers 28 are provided below the contact trenches 27. Also, each contact layer 28 is formed between two trench portions so as to extend in the extending direction of the two trench portions. The contact layers 28 may be formed by implanting dopants via the contact trenches 27. For example, the contact layers 28 are formed by implanting boron (B) or boron fluoride ($BF_2$). The contact layers 28 may be formed by implanting two or more types of dopants in two or more steps. The contact layers 28 of the present example are of P+ types. The contact layers 28 suppress latch-ups by extracting holes. Note that, the contact layers 28 are one example of the first contact layer.

Also, peaks of a doping concentration in the contact layers 28 are positioned shallower than positions of the lower ends of the source regions 12. That is, peaks of a doping concentration in the contact layers 28 of the present example are formed away from side walls of the base regions 14 in which the threshold voltage Vth is decided. Thereby, even if miniaturized, the contact layers 28 of the present example have a small influence on the threshold voltage Vth. Also, each contact layer 28 may have a plurality of peaks of a doping concentration. Preferably, a peak of the maximum concentration among a plurality of peaks in a contact layer 28 is positioned shallower than a position of a lower end of a source region 12.

The buffer region 20 is formed on the back surface side of the drift region 18. A doping concentration of the buffer region 20 is higher than a doping concentration of the drift region 18. Depletion layers expanding from the back surface sides of the base regions 14. The buffer region 20 functions as a field stop layer to prevent the depletion layers from reaching the collector region 22 and the cathode region 82. The buffer region 20 of the present example is of an N− type.

The contact regions 15 are formed above the base regions 14. The contact regions 15 have doping concentrations higher than the doping concentrations of the base regions 14. The contact regions 15 may be formed by implanting dopants from the upper surface sides of the base regions 14. The contact regions 15 of the present example are of P+ types.

The accumulation regions 16 are formed between the drift region 18 and the base regions 14. The accumulation regions 16 are formed to have concentrations higher than a doping concentration of the semiconductor substrate 10. Also, the doping concentrations of the accumulation regions 16 are higher than the doping concentration of the drift region 18. In one example, the doping concentrations of the accumulation regions 16 are from $1E16$ $cm^{-3}$ to $1E18$ $cm^{-3}$ inclusive. For example, the accumulation regions 16 are formed by implanting N type dopants such as phosphorous from the upper surface side of the semiconductor substrate 10. Note that, the E means 10 to the power of, for example, $1E16$ $cm^{-3}$ means $1 \times 10^{16}$ $cm^{-3}$.

Also, each accumulation region 16 is formed between adjacent trench portions. For example, an accumulation region 16 is formed between a dummy trench portion 30 and a gate trench portion 40 in the transistor portion 70. The accumulation region 16 may be provided such that it covers the entire region between the dummy trench portion 30 and the gate trench portion 40. By providing the accumulation region 16, holes implanted from the collector region 22 to the drift region 18 are suppressed from flowing into the base region 14 in an ON state. Thereby, implanting electrons from the source region 12 to the base region 14 is facilitated. Thereby, the ON voltage of the semiconductor device 100 is reduced.

However, if a semiconductor device 100 has accumulation regions 16, carrier density rises by carrier Injection-Enhancement (IE) effect, and latch-ups are prone to occur. In the semiconductor device 100 of the present example, holes are extracted by the contact layers 28 at a time of turn-off. Thereby, it is possible to suppress latch-ups. Therefore, in the semiconductor device 100, it is possible to reduce the ON voltage as well as to suppress latch-ups.

The collector region 22 is formed on the back surface side of the buffer region 20 in the transistor portion 70. The cathode region 82 is formed on the back surface side of the buffer region 20 in the diode portion 80. Also, the back surfaces of the collector region 22 and the cathode region 82 are provided with the collector electrode 24. The collector electrode 24 is formed of a metal material such as aluminum, gold, or silver.

The contact holes 55, 56, and 57 are formed, penetrating through the interlayer dielectric film formed above the semiconductor substrate 10. The contact hole 55 connects the gate metal layer 50 and a gate conductive portion 44. The contact holes 56 connect the emitter electrode 52 and dummy conductive portions 34. The contact hole 57 connects the emitter electrode 52 and an emitter conductive portion 64. Positions to form the contact holes 55, 56, and 57 are not particularly limited to those in the present example.

The emitter electrode 52 contacts the semiconductor substrate 10 through the contact holes 56 and 57. The emitter electrode 52 is formed of a material containing metal. In one example, at least a part of a region of the emitter electrode 52 is formed of aluminum. The emitter electrode 52 may have a region formed of a material containing tungsten.

The gate metal layer 50 contacts the semiconductor substrate through the contact hole 55. The gate metal layer 50 is formed of a material containing metal. In one example, at least a part of a region of the gate metal layer 50 is formed of aluminum. The gate metal layer 50 may have a region formed of a material containing tungsten. The gate metal layer 50 of the present example is formed of the same material as a material of the emitter electrode 52. However, the gate metal layer 50 may be formed of a material different from the material of the emitter electrode 52.

Two or more gate trench portions 40, two or more dummy trench portions 30, and two or more emitter trench portions 60 are formed on the upper surface side of the semiconductor substrate 10. The order of arrangement of the trench portions is not limited to that of the present example.

The dummy trench portions 30 and the gate trench portions 40 are formed from the upper end sides of the source regions 12, penetrating through the source regions 12, the base regions 14, and the accumulation regions 16. Also, the dummy trench portions 30 and the gate trench portions 40 are formed extending in predetermined extending directions on the upper surface of the semiconductor substrate 10. One or more dummy trench portions 30 are arranged along a predetermined arrangement direction while leaving a predetermined gap from the gate trench portions 40 in a region of the transistor portion 70. The dummy trench portions 30 and the gate trench portions 40 of the present example are formed extending in a direction perpendicular to the arrangement direction. The dummy trench portions 30 and the gate trench portions 40 may have loop shapes at their ends in extending directions, respectively.

The gate trench portions 40 and the dummy trench portions 30 of the present example are alternately arranged in a predetermined arrangement direction. Also, the trench portions may be arranged leaving a regular gap from each other. However, arrangement of each trench is not limited to the above-mentioned example. A plurality of gate trench portions 40 may be arranged between two dummy trench portions 30. Also, each number of gate trench portions 40 provided between dummy trench portions 30 may not be constant.

The emitter trench portions 60 are formed from the upper end sides of the source regions 12, penetrating through the source regions 12, the base regions 14, and the accumulation regions 16. The emitter trench portions 60 are provided in a region of the diode portion 80. The emitter trench portions 60 are formed extending in predetermined extending directions on the upper surface of the semiconductor substrate 10. A gap between emitter trench portions 60 of the present example may match a gap between a dummy trench portion 30 and a gate trench portion 40, but this is not essential. Note that, a P+ type well region 17 is formed at ends in the extending directions of the dummy trench portions 30, the gate trench portions 40, and the emitter trench portions 60.

The gate trench portions 40 have dielectric films 42 and gate conductive portions 44 formed on the upper surface side of the semiconductor substrate 10. The gate conductive portions 44 at least include a region facing an adjacent base region 14. If predetermined voltages are applied to the gate conductive portions 44 via the gate metal layer 50, channels are formed in the base region 14, at shallow portions over the gate trench portion 40. The gate conductive portions 44 of the present example are formed of conductive materials such as polysilicon. The gate conductive portions 44 are one example of trench conductive portions. The dielectric films 42 may be formed by oxidizing or nitriding semiconductors at the inner walls of gate trenches so as to cover around the gate conductive portions 44.

The dummy trench portions 30 have dielectric films 32 and the dummy conductive portions 34 which are formed on the upper surface side of the semiconductor substrate 10. The dummy conductive portions 34 may be formed of the same materials as materials of the gate conductive portions 44. For example, the dummy conductive portions 34 are formed of conductive materials such as polysilicon. The dummy conductive portions 34 are one example of trench conductive portions. The dielectric films 32 may be formed by oxidizing or nitriding semiconductors at the inner wall of dummy trenches so as to cover around the dummy conductive portions 34.

The diode portion 80 is provided in a region in direct contact with the transistor portion 70. The diode portion 80 has base regions 14, accumulation regions 16, a drift region 18, and a buffer region 20 that are similar to those in the transistor portion 70. The cathode region 82 is provided on the back surface side of the buffer region 20 in the diode portion 80. Note that, in the present specification, a region of the lower surface, which corresponds to the cathode region 82 in an active region, is taken as the diode portion 80. Alternatively, a projection region on which the cathode region 82 is projected may be taken as the diode portion 80, when the cathode region 82 is projected on the upper surface of the semiconductor substrate 10 in a direction perpendicular to the lower surface of the semiconductor substrate 10. Also, in an active region, a projection region on which the collector region 22 is projected is taken as the transistor portion 70, when the collector region 22 is projected on the upper surface of the semiconductor substrate 10 in a direction perpendicular to the lower surface of the semiconductor substrate 10. The projection region is also a region in which predetermined unit configurations, each including a source region 12 and a contact region 15, are regularly arranged.

In the diode portion 80, the cathode region 82 may be positioned in a direction away from an outermost contact region 15 in the Y axis direction (the +Y direction in the Y axis direction of FIG. 1A), away from a boundary position between a source region 12 and the contact region 15 on the upper surface of the semiconductor substrate 10. Also, the cathode region 82 may be positioned in a direction away from an end of a contact trench 27 in the Y axis direction (the +Y direction in the Y axis direction of FIG. 1A), away from the end. Thereby, it is possible to suppress excessive implantation of holes from the contact regions 15.

The emitter trench portions 60 are formed, reaching the drift region 18 from the upper surface sides of the base regions 14, penetrating through the base regions 14 and the accumulation regions 16. Each emitter trench portion 60 includes a dielectric film 62 and an emitter conductive portion 64. Dielectric films 62 may be formed by oxidizing or nitriding semiconductors at the inner walls of emitter trenches so as to cover around emitter conductive portions 64.

Figure 2:
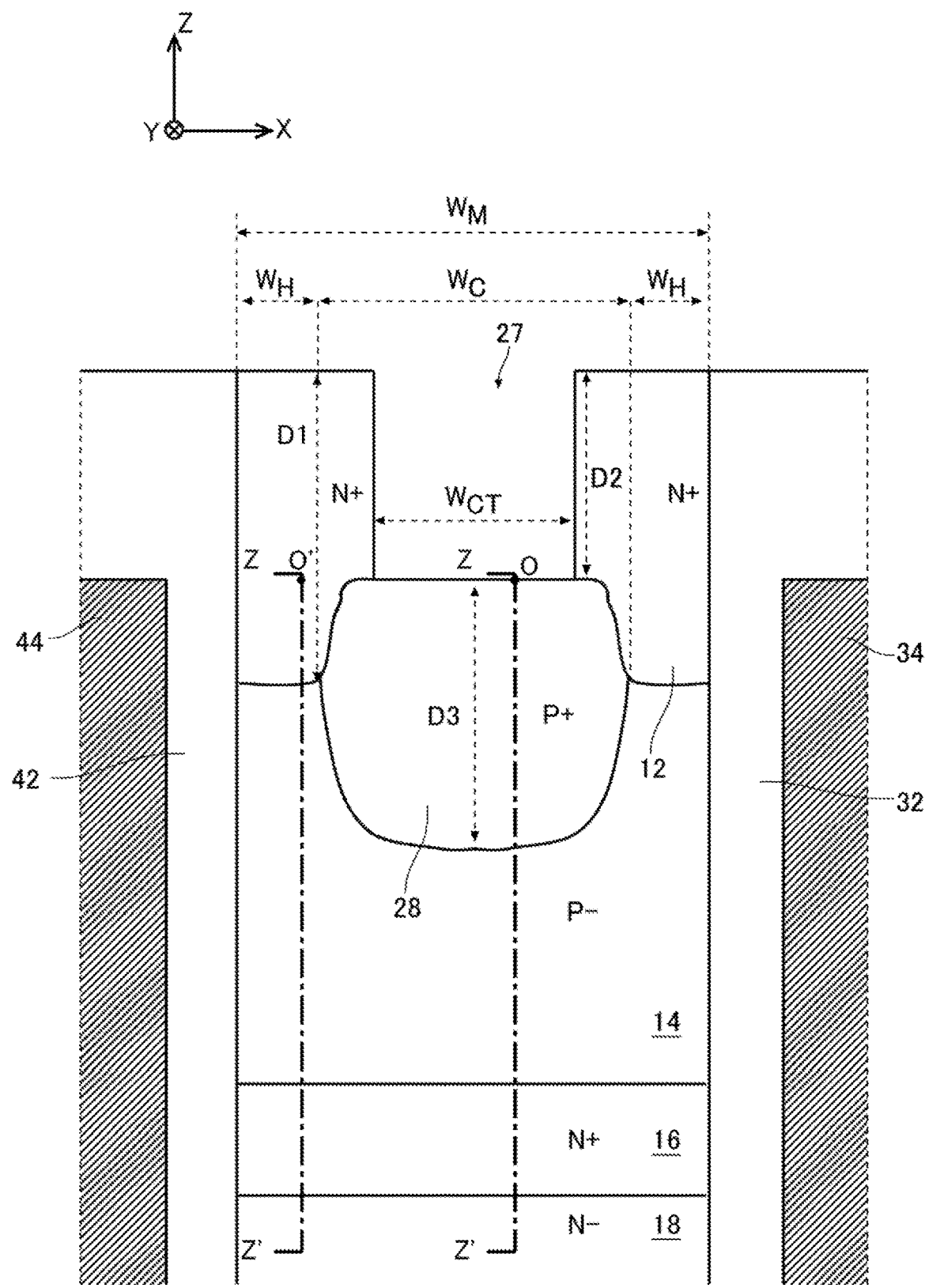
FIG. 2 illustrates one example of an enlarged view in the vicinity of a contact layer 28.

FIG. 2 illustrates one example of an enlarged view in the vicinity of a contact layer 28. The present example shows a mesa portion between a dummy trench portion 30 and a gate trench portion 40. However, any mesa portions between a pair of portions which are any two among the dummy trench portions 30, the gate trench portions 40, and the emitter trench portions 60 may have the same structure as a structure of the mesa portion in the present example.

A mesa width $W_M$ represents a width of a mesa portion in the X axis direction. The mesa width $W_M$ of the present example is a mesa width of the mesa portion between the dummy trench portion 30 and the gate trench portion 40. The mesa width $W_M$ of the present example is 0.7 μm.

A hole extraction width $W_H$ is a width of a lower end of a source region 12 in the X axis direction. That is, the hole extraction width $W_H$ is a distance from a side wall of a trench portion to a contact layer 28. The hole extraction width $W_H$ corresponds to the distance of holes to flow from the side wall of the trench portion through which the holes have passed to the contact layer 28. Shortening the hole extraction width $W_H$ lowers a resistance value of a path for extracting the holes. Thereby, the holes are likely to be extracted at a time of turn-off. If the holes are likely to be extracted, it is difficult for a parasitic NPN transistor to operate. Thereby, latch-ups are suppressed.

In one example, the hole extraction width $W_H$ measures from 10% to 30% inclusive of the mesa width $W_M$. If two source regions 12 are formed between adjacent trench portions like those in the present example, the hole extraction width $W_H$ represents a width of a lower end of any one of the source regions 12. That is, if source regions 12 are formed at both ends of a mesa respectively, the hole extraction width $W_H$ accounts for 20 to 60% inclusive of the mesa width $W_M$. For example, the hole extraction width $W_H$ is from 0.05 μm to 0.25 μm inclusive. The hole extraction width $W_H$ of the present example is 0.1 μm.

A contact width $W_C$ is a width of a region in the mesa width $W_M$ in the X axis direction excluding the hole extraction width $W_H$. That is, the contact width $W_C$ represents a width of a contact layer 28 in the X axis direction, at the same depth as a position of a lower end of a source region 12. In one example, the contact width $W_C$ accounts for 40 to 80% inclusive of the mesa width $W_M$. For example, the contact width $W_C$ is from 0.2 μm to 0.6 μm inclusive. The contact width $W_C$ of the present example is 0.5 μm.

A contact trench width $W_{CT}$ is a width of a contact trench 27 in the X axis direction. In one example, the contact trench width $W_{CT}$ is from 0.1 μm to 0.4 μm inclusive. The contact trench width $W_{CT}$ of the present example is 0.3 μm. Also, a depth D2 of the contact trench 27 is 0.3 μm from the upper end of the semiconductor substrate 10. The contact trench width $W_{CT}$ and the depth D2 may be decided depending on a required contact resistance. Also, the contact trench width $W_{CT}$ may be decided depending on the size of a contact layer 28 that is formed by implanting ion over a contact trench 27.

A lower end of a source region 12 is positioned deeper than a position of a lower end of a contact trench 27. In addition, a peak of a doping concentration of the contact layer 28 is formed at a position shallower than the position of the lower end of the source region 12. Thereby, even if miniaturized, contact layers 28 have a small influence on the threshold voltage Vth. Note that, the lower end of the source region 12 is positioned deeper than positions of upper ends of a dummy conductive portion 34 and a gate conductive portion 44. A depth D1 of a lower end of a source region 12 of the present example is 0.45 μm from the upper end of the semiconductor substrate 10.

An upper end of a contact layer 28 is positioned shallower than the position of the lower end of the source region 12. Also, a lower end of the contact layer 28 is positioned deeper than the position of the lower end of the source region 12. Forming a thick contact layer 28 makes holes likely to be extracted. Thereby, latch-ups are likely to be suppressed. In one example, the lower end of the contact layer 28 may be positioned as deep as the position of a lower end of a base region 14. In this case, because the lower end of the contact layer 28 is distanced from the source region 12, a hole extraction effect becomes more significant. For example, a thickness D3 in a depth direction of the contact layer 28 is from 0.1 μm to 1.0 μm inclusive. A thickness D3 in a depth direction of the contact layer 28 of the present example is 0.5 μm.

Note that, the contact layer 28 may be formed such that the lower end of the contact layer 28 is positioned shallower than a position half the thickness of the base region 14. Forming a shallow contact layer 28 allows the number of times to implant ions for forming the contact layer 28 to be reduced. Thus, a cost of manufacturing semiconductor devices 100 is reduced.

Also, below a contact trench 27, a doping concentration of a contact layer 28 may be larger than a doping concentration of a source region 12 at the same depth. That is, a region below the contact trench 27 is a region in which an N+ type source region 12 has changed into a P+ type contact layer 28 by implanting a high concentration dopant.

Figure 3:
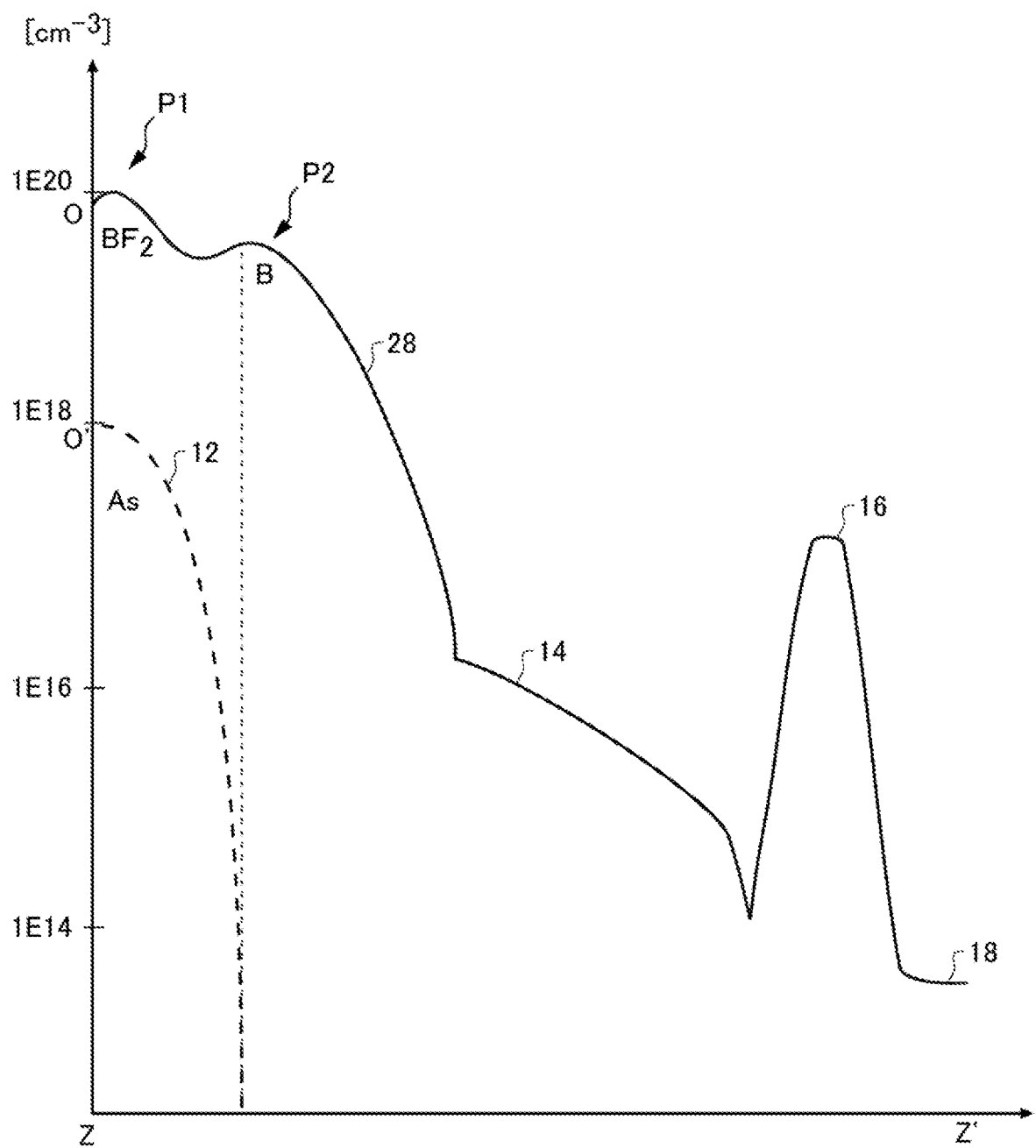
FIG. 3 illustrates examples of doping concentration distributions in cross-sections Z-Z' in the vicinity of the contact layer 28 in FIG. 2.

FIG. 3 illustrates examples of doping concentration distributions in cross-sections Z-Z' in the vicinity of the contact layer 28 in FIG. 2. The vertical axis represents the doping concentration, and the horizontal axis represents the distance in the depth direction from the lower end of the contact trench 27. The solid line represents doping concentrations of the contact layer 28 and the base region 14 observed in the depth direction from the point O. The dashed line represents a doping concentration of the source region 12 observed in the depth direction from the point O'. That is, the graph of the doping concentration distributions of the present example displays doping concentrations in the depth directions from two different points O and O' respectively, in an overlapping manner. Note that, the point O and the point O' represent origins of the graph of the doping concentrations illustrated in FIG. 3, respectively. The depth of the point O and the depth of the point O' correspond to a depth of the lower end of the contact trench 27.

The source region 12 is formed by ion implanting arsenic (As) from the upper surface side of the base region 14. The doping concentration of the source region 12 is approximately $1E18$ $cm^{-3}$ at the point O' of the lower end of the contact trench 27.

The contact layer 28 is formed by ion implanting boron fluoride and boron over the contact trench 27 in two steps. The first peak P1 of the contact layer 28 is approximately $1E20$ $cm^{-3}$. The first peak P1 of the contact layer 28 is formed at a position shallower than a position of the lower end of the source region 12. The second peak P2 of the present example is formed at a position deeper than the position of the lower end of the source region 12. However, the second peak P2 may be formed at a position shallower than the position of the lower end of the source region 12.

Also, the contact layer 28 may have three or more peaks. In this case, all of the peaks may be formed at a position shallower than the position of the lower end of the source region 12, or a part of the peaks may be formed at a position deeper than the position of the lower end of the source region 12. That is, it is sufficient if at least one of the peaks of the doping concentration of the contact layer 28 is formed at a position shallower than the position of the lower end of the source region 12. Also, among the peaks of the doping concentration of the contact layer 28, the maximum peak may be formed at a position shallower than the position of the lower end of the source region 12.

Note that, the distributions of the doping concentrations of the present example is merely one example. To realize the semiconductor device 100 disclosed in the present specification, the number of the peaks, the depth, or the like may be changed appropriately.

Figure 4:
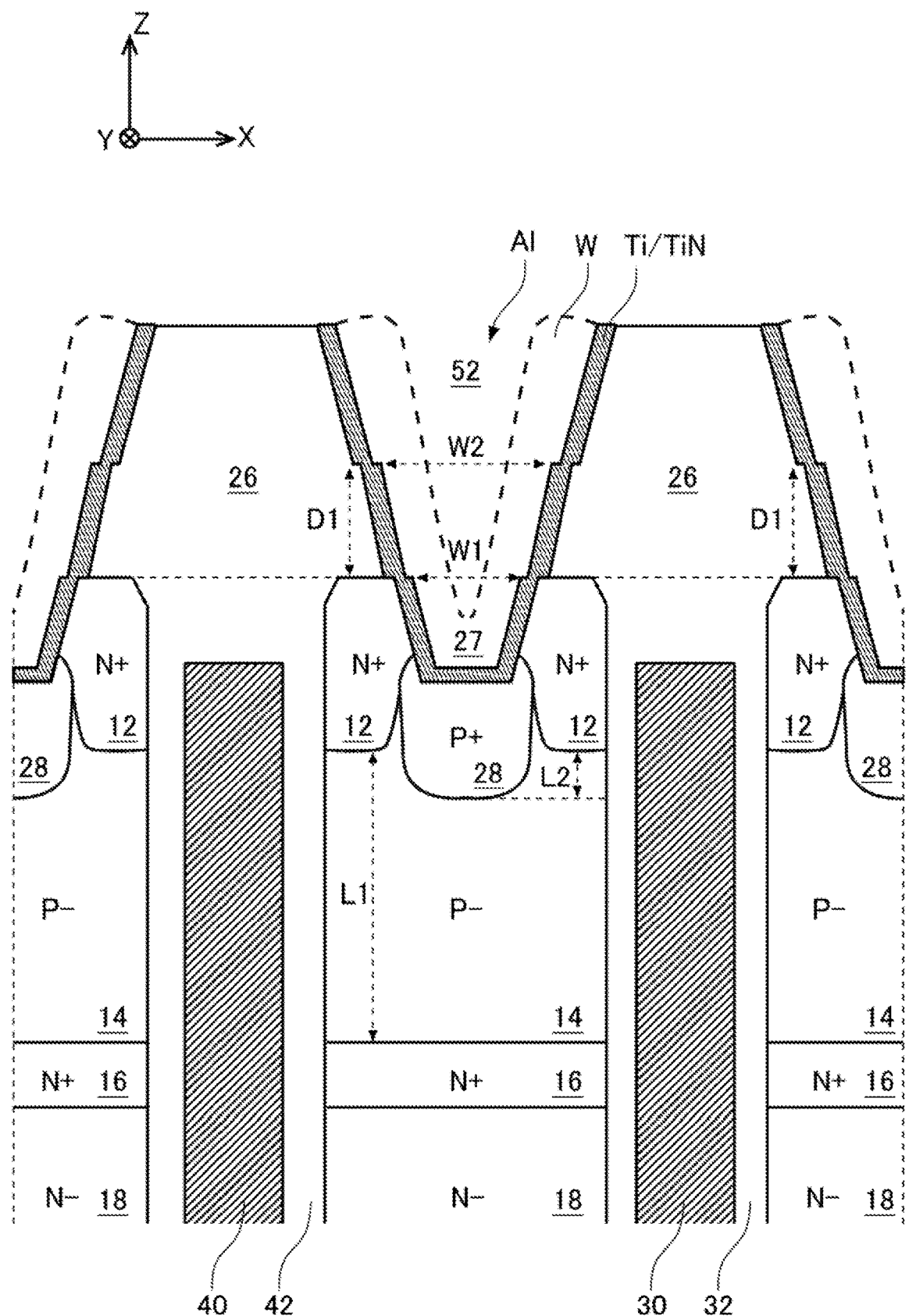
FIG. 4 illustrates a more concrete example of a structure of a semiconductor device 100.

FIG. 4 illustrates a more concrete example of a structure of a semiconductor device 100. In the present example, an interlayer dielectric film 26 is not omitted from the drawing.

The interlayer dielectric film 26 is formed above the semiconductor substrate 10. The interlayer dielectric film 26 of the present example is a BPSG (Boron Phosphorus Silicon Glass) film. The interlayer dielectric film 26 may have a plurality of layers formed of different materials. In a layer with a thickness D1 from the upper end of the source region 12, the interlayer dielectric film 26 has a lower end opening of which width is W1 and an upper end opening of which width is W2.

A contact trench 27 is tapered. A contact trench 27 of the present example is tapered such that its width of the upper end is larger than its width of the lower end. The tapered contact trench 27 facilitates implanting dopants in side walls of the contact trench 27.

A contact layer 28 is formed over the tapered contact trench 27. Thereby, the contact layer 28 is formed on at least parts of side walls of the contact trench 27. For example, a contact layer 28 of the present example is formed upwardly extending in direct contact with side walls of the contact trench 27 from the lower end of the contact trench 27. Also, a contact width $W_C$ changes depending on an opening width W1 at the lower end of a BPSG film. That is, a hole extraction width $W_H$ also changes depending on the opening width W1 at the lower end of the BPSG film. In the present example, an opening width W2 at the upper end of the BPSG film is 0.45 μm, and an opening width W1 at the lower end of the BPSG film is 0.3 μm.

Also, a contact layer 28 may be formed in direct contact with an accumulation region 16. In this case, L1=L2. The distance L1 represents a distance in a depth direction between a lower end of a source region 12 and an upper end of an accumulation region 16. The distance L2 represents a distance in a depth direction between a lower end of a source region 12 and a lower end of a contact layer 28. Also, the lower end of the contact layer 28 may be provided at a position deeper than half the distance between the upper end of the accumulation region 16 and the lower end of the source region 12. In this case, L1/2<L2.

Note that, a multi-layered film may be formed as an emitter electrode 52 on the contact trench 27 and an opened interlayer dielectric film 26. In one example, the emitter electrode 52 may have a structure in which titanium/titanium nitride (Ti/TiN), tungsten, and aluminum are stacked.

Comparative Example 1

Figure 5A:
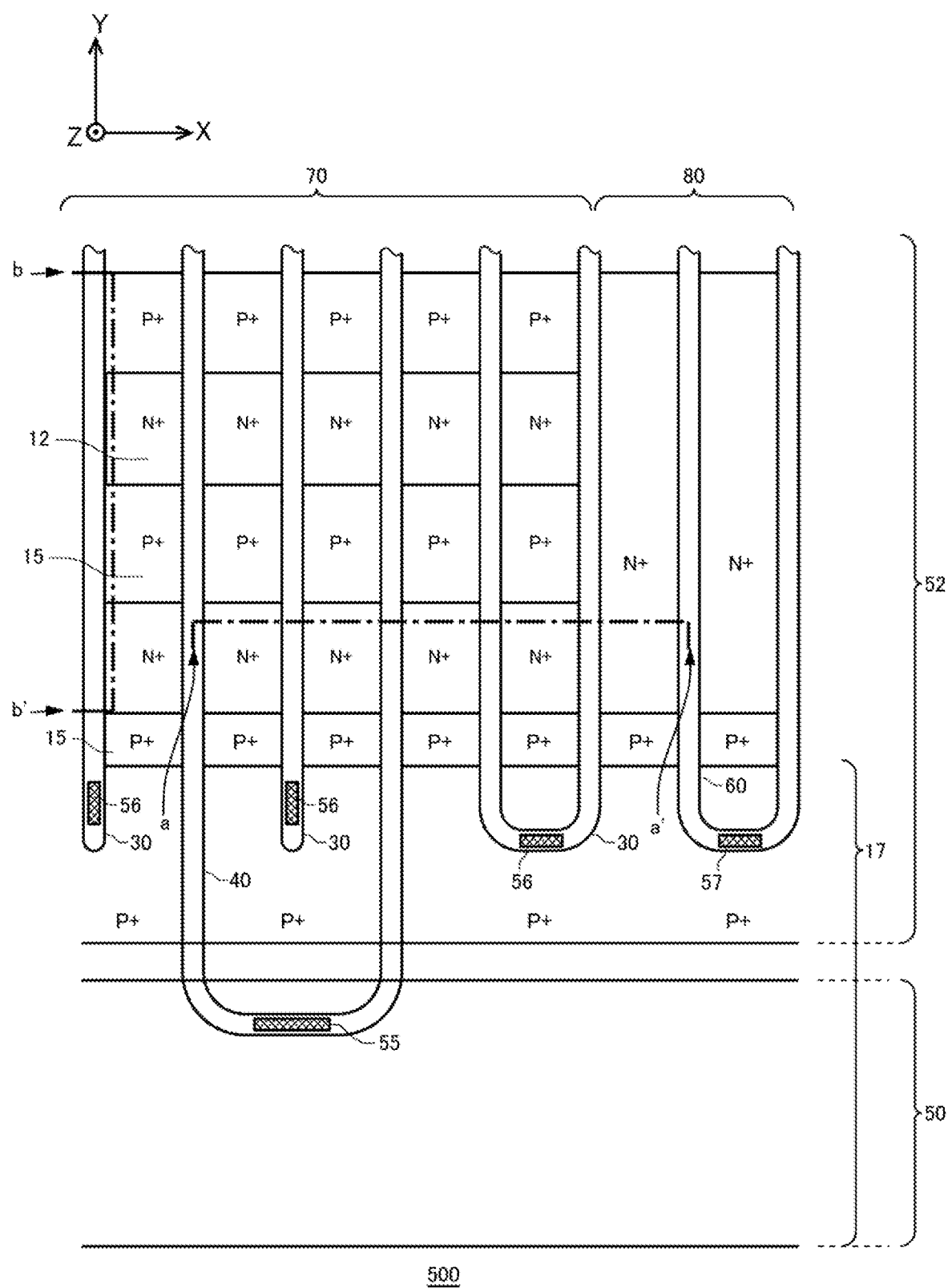
FIG. 5A is a plan view illustrating one example of a semiconductor device 500 according to Comparative Example 1.
Figure 5B:
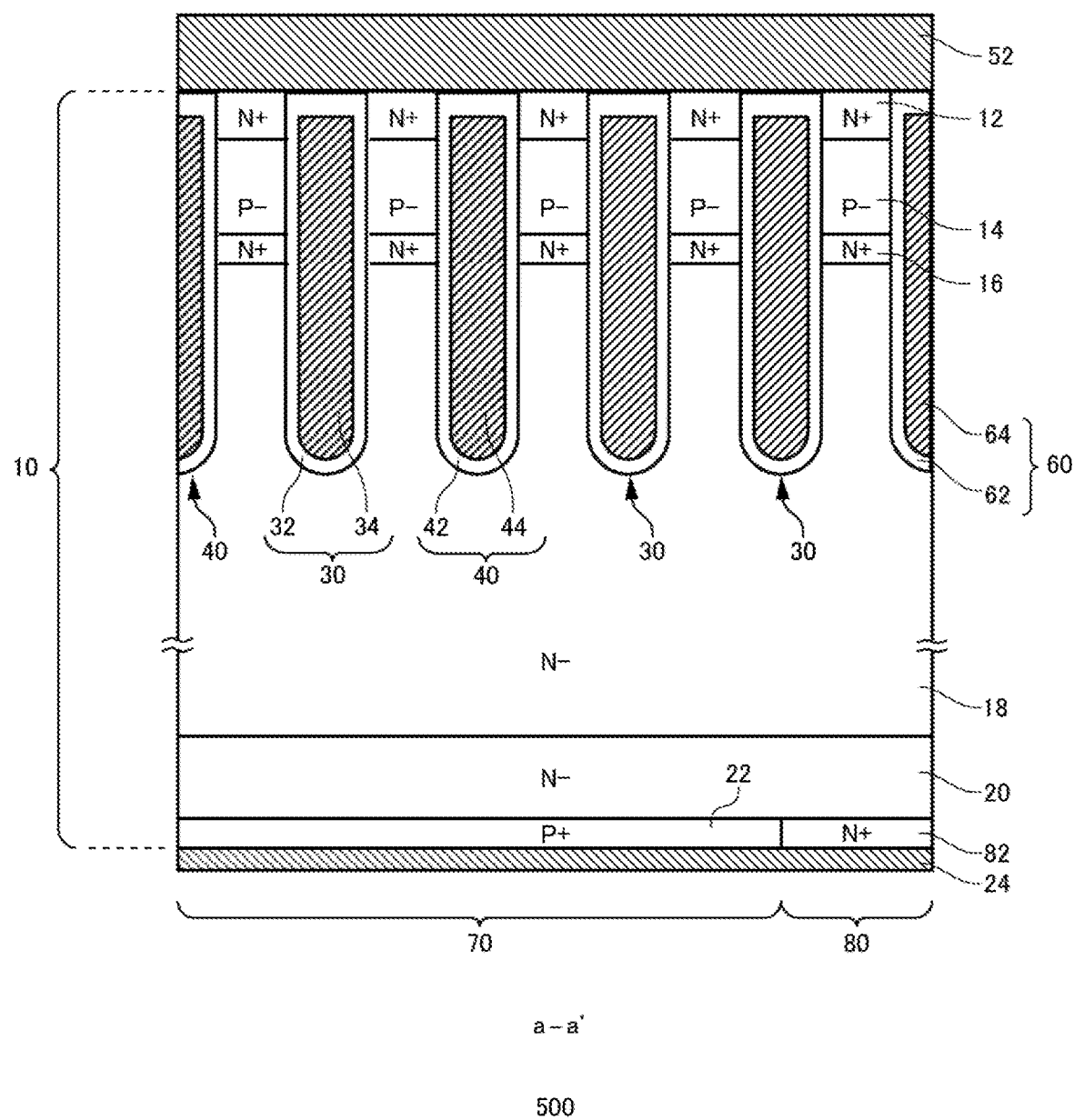
FIG. 5B illustrates one example of the cross-section a-a' of the semiconductor device 500 according to Comparative Example 1.
Figure 5C:
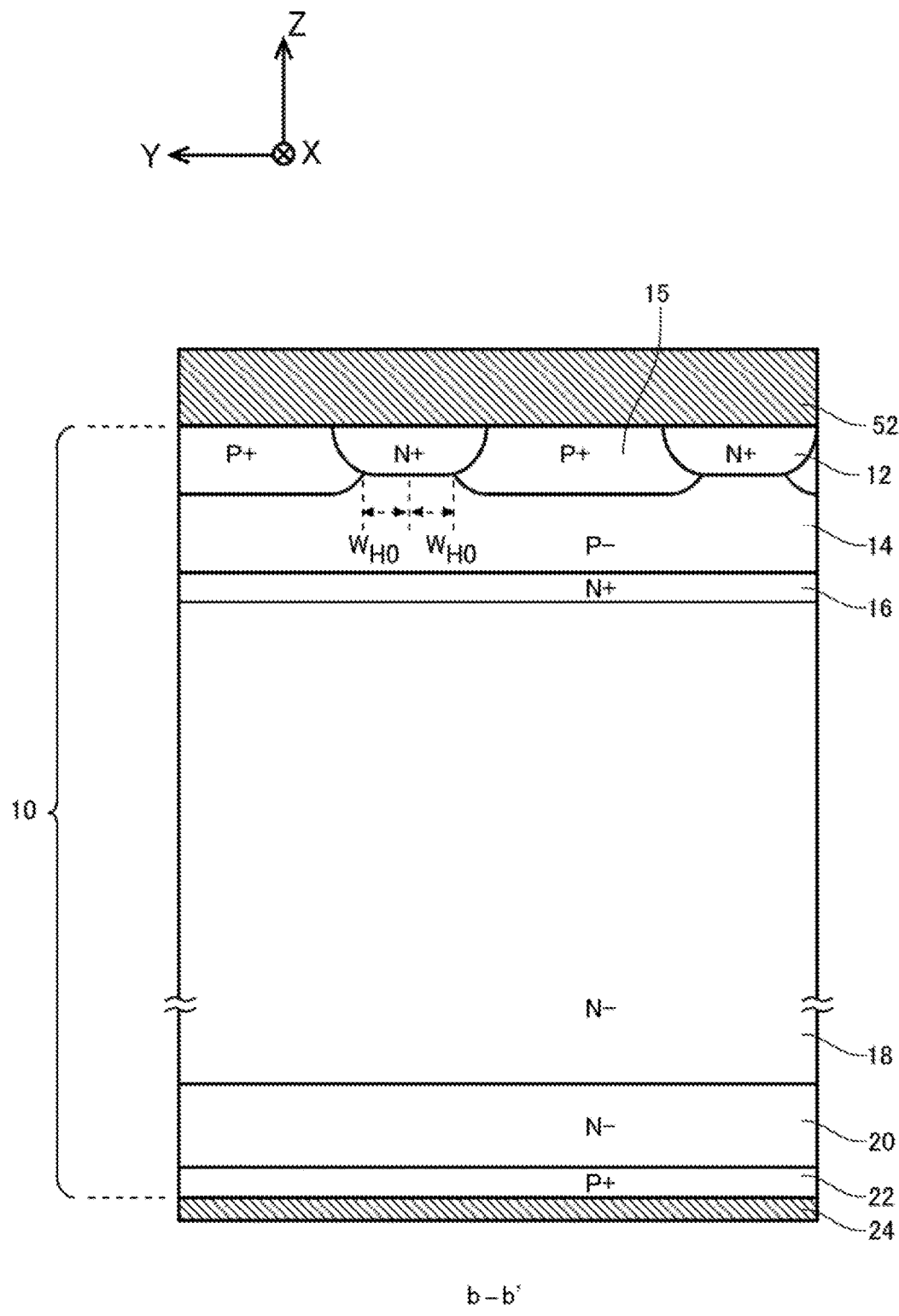
FIG. 5C illustrates one example of the cross-section b-b' of the semiconductor device 500 according to Comparative Example 1.

FIG. 5A is a plan view illustrating one example of a semiconductor device 500 according to Comparative Example 1. FIG. 5B illustrates one example of the cross-section a-a' of the semiconductor device 500 according to Comparative Example 1. FIG. 5C illustrates one example of the cross-section b-b' of the semiconductor device 500 according to Comparative Example 1.

The semiconductor device 500 of the present example does not have contact trenches 27 and contact layers 28. A hole extraction width $W_{H0}$ represents a distance of carriers to flow along a side wall of a trench portion to a contact region 15. In the semiconductor device 500, holes flow through a side wall of a gate trench portion 40 under a source region 12, then flow from the side wall of the gate trench portions 40 to the contact region 15.

Here, the hole extraction width $W_{H0}$ in the extending direction of a trench portion may be wider than a hole extraction width in the arrangement direction of a trench portion. In this case, the hole extraction width $W_{H0}$ of the semiconductor device 500 is wider than a hole extraction width $W_H$ of a semiconductor device 100. That is, a hole extraction efficiency is decreased, and suppressing latch-ups in the semiconductor device 500 becomes difficult. Particularly, as the miniaturizing progresses, current density in mesa portions rises. Thereby, latch-ups are likely to occur at a time of turn-off in the semiconductor device 500.

Figure 6:
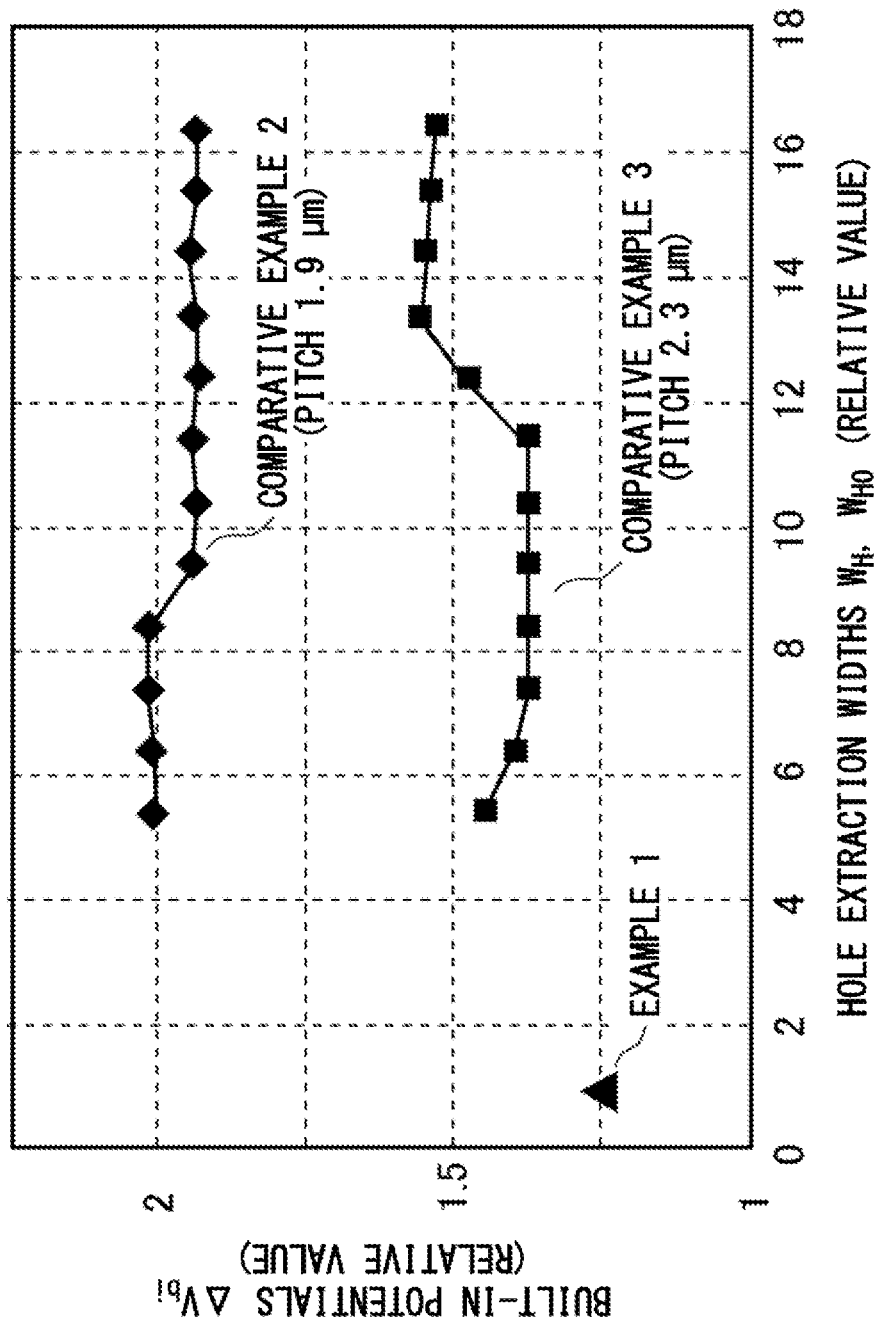
FIG. 6 is a graph illustrating built-in potentials $\Delta V_{bi}$ of Example 1 and Comparative Examples 2 and 3.

FIG. 6 is a graph illustrating built-in potentials $\Delta V_{bi}$ of Example 1 and Comparative Examples 2 and 3. The vertical axis represents the relative value of the built-in potential $\Delta V_{bi}$, and the horizontal axis represents the relative value of hole extraction widths $W_H$, and $W_{H0}$. Illustrated is a case in which Example 1 and Comparative Example 2 have pitches of 1.9 μm. Illustrated is a case in which Comparative Example 3 has a pitch of 2.3 μm. A pitch refers to a distance from a center of a certain trench portion to a center of another trench portion adjacent to the certain trench portion in the arrangement direction. Once a relative value of a built-in potential $\Delta V_{bi}$ becomes 2, a latch-up occurs.

The smaller a pitch becomes by miniaturizing, the narrower the hole extraction width $W_H$ in Example 1 becomes. On the other hand, even if a pitch becomes smaller by miniaturizing, the hole extraction widths $W_{H0}$ according to Comparative Examples 2 and 3 do not necessarily become narrower. Therefore, the smaller the pitch becomes by miniaturizing, the relatively narrower the hole extraction width $W_H$ becomes as compared with the hole extraction width $W_{H0}$. For example, if the hole extraction width $W_H$ according to Example 1 is 1, the hole extraction widths $W_{H0}$ of Comparative Examples 2 and 3 are approximately 50% to 170% of the size of the width $W_H$ of the Example 1.

Also, in Comparative Examples 2 and 3, if pitches are miniaturized from 2.3 μm to 1.9 μm, the built-in potentials $\Delta V_{bi}$ rise. If the built-in potentials $\Delta V_{bi}$ rise, latch-ups are likely to occur in semiconductor devices 500. On the other hand, with respect to Example 1, because the hole extraction width $W_H$ is short, and holes are likely to be extracted, it is possible to suppress latch-ups even if miniaturizing progresses. If anything, with respect to Example 1, holes are extracted in the arrangement direction. Thereby, the smaller the pitch becomes, the shorter the hole extraction width $W_H$ becomes.

Example 2

Figure 7A:
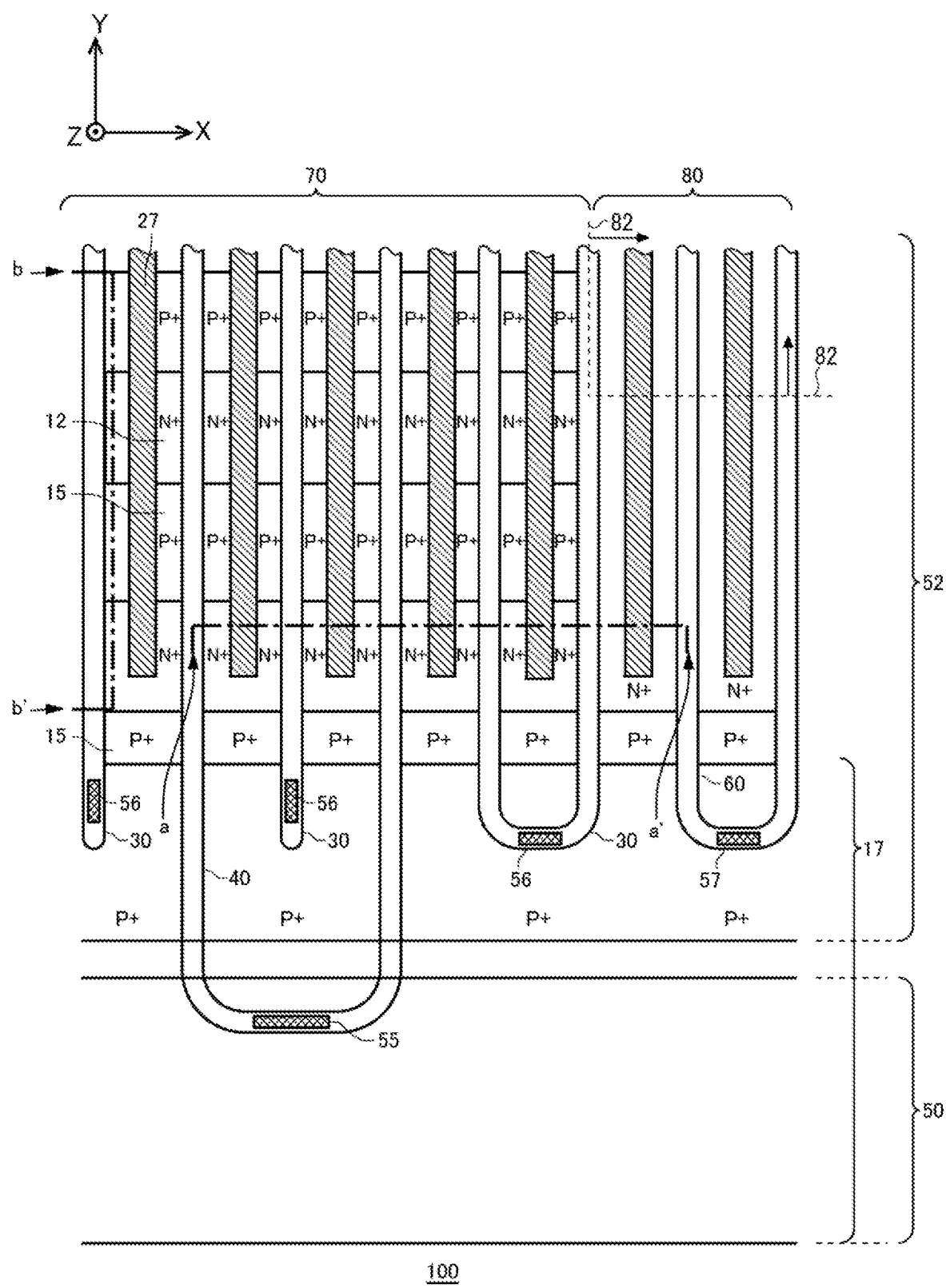
FIG. 7A is a plan view illustrating one example of a semiconductor device 100 according to Example 2.
Figure 7B:
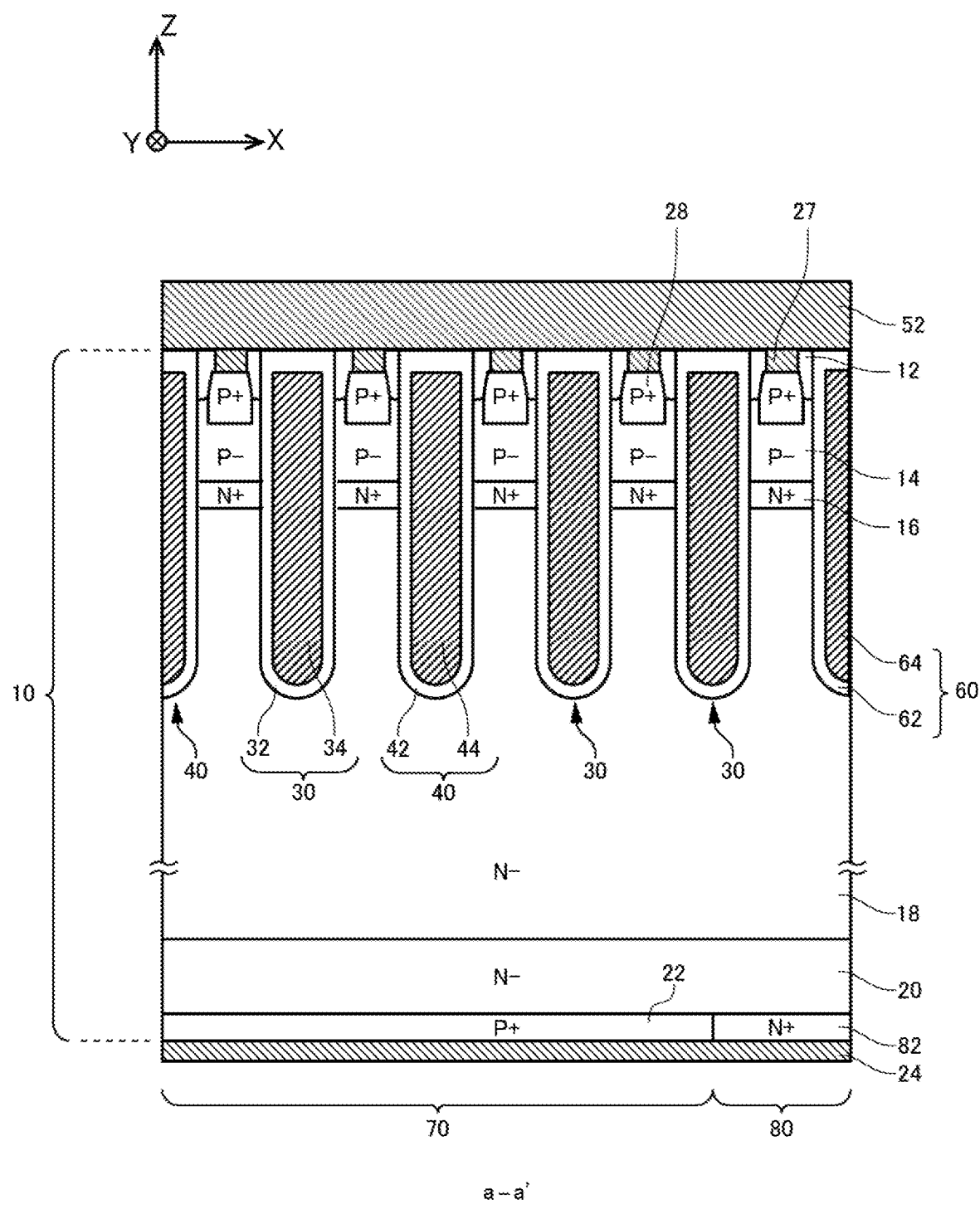
FIG. 7B illustrates one example of the cross-section a-a' of the semiconductor device 100 according to Example 2.
Figure 7C:
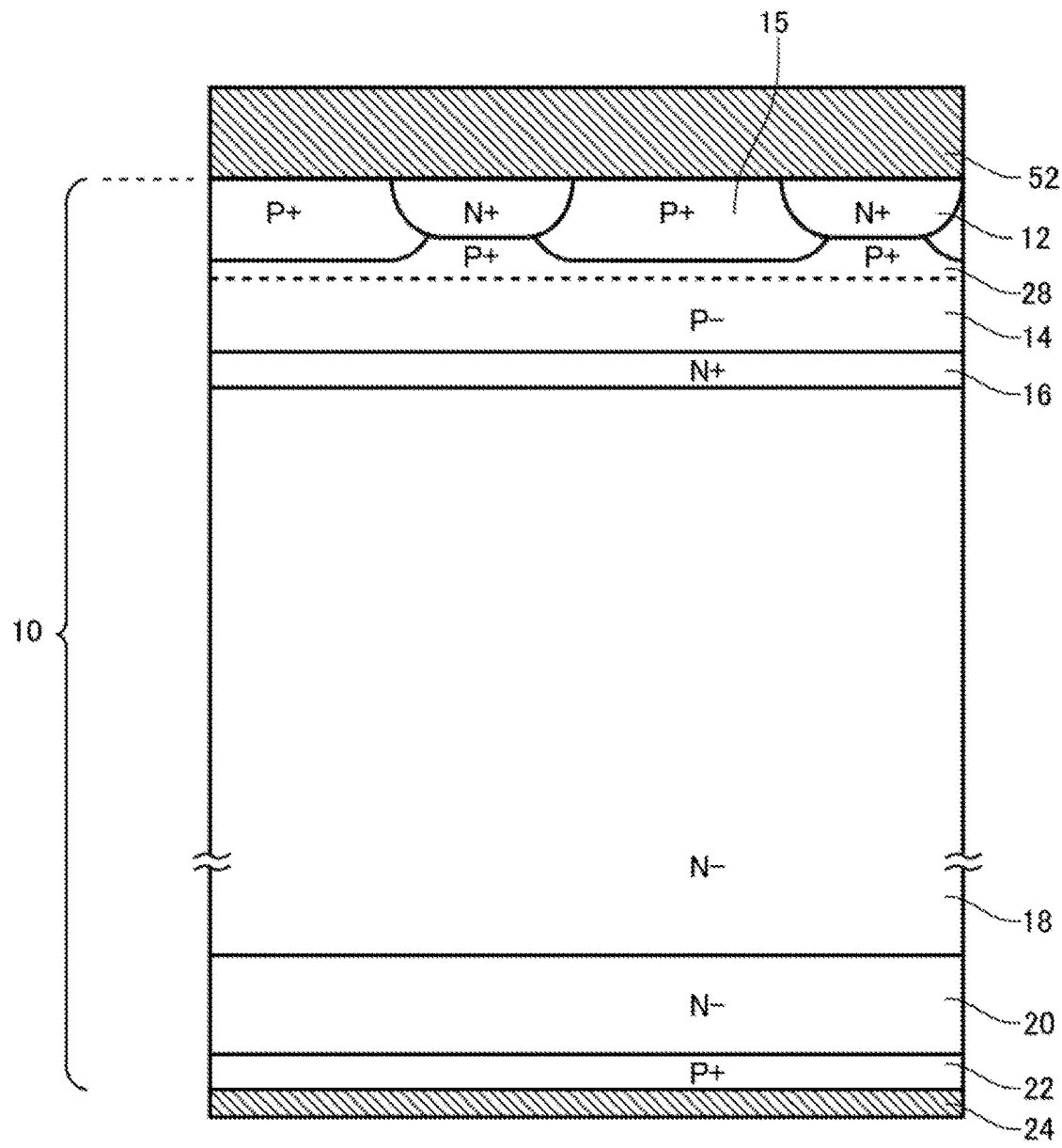
FIG. 7C illustrates one example of the cross-section b-b' of the semiconductor device 100 according to Example 2.

FIG. 7A is a plan view illustrating one example of a semiconductor device 100 according to Example 2. FIG. 7B illustrates one example of the cross-section a-a' of the semiconductor device 100 according to Example 2. FIG. 7C illustrates one example of the cross-section b-b' of the semiconductor device 100 according to Example 2. Source regions 12 and contact regions 15 of the present example are alternately provided in the extending directions of trench portions in a transistor portion 70.

The source regions 12 and the contact regions 15 are formed on the upper surface side of a semiconductor substrate 10. Source regions 12 and contact regions 15 are formed from one trench portion to the other adjacent trench portion. Then, a contact trench 27 is formed in the extending direction of a trench portion such that the contact trench 27 transverses the source regions 12 and the contact regions 15. Thereby, the source regions 12 and the contact regions 15 are alternately provided in extending directions of trench portions, along side walls of the trench portions respectively. Note that, in a diode portion 80 of the present example, a source region 12 is formed between adjacent emitter trench portions 60, in a similar manner as forming the source region 12 of the Example 1.

In the diode portion 80, the cathode region 82 may be positioned in a direction away from an outermost contact region 15 in the Y axis direction (the +Y direction in the Y axis direction of FIG. 7A), away from a boundary position between a source region 12 and the contact region 15 on the upper surface of the semiconductor substrate 10. Also, the cathode region 82 may be positioned in a direction away from an end of a contact trench 27 in the Y axis direction (the +Y direction in the Y axis direction of FIG. 7A), away from the end. Thereby, it is possible to suppress excessive holes from being implanted from the contact regions 15.

Similar to the semiconductor device 100 according to Example 1, because the semiconductor device 100 of the present example has contact layers 28 formed below contact trenches 27, it is possible to suppress latch-ups by hole extraction. Also, the source regions 12 and the contact regions 15 are alternately provided in the semiconductor device 100 of the present example. Thereby, a saturation current is suppressed, and thus latch-ups can be further suppressed.

Example 3

Figure 8:
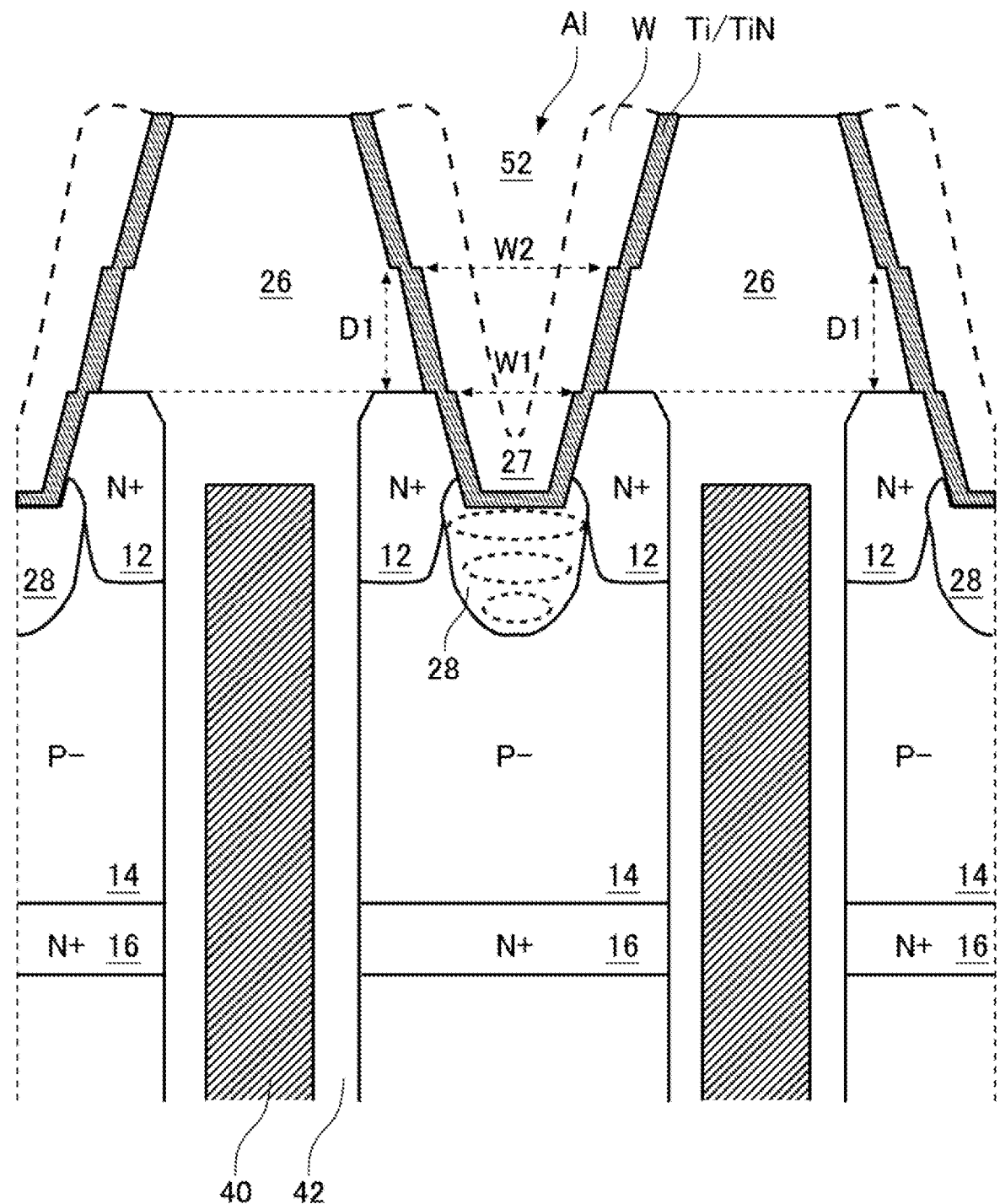
FIG. 8 illustrates one example of configuration of a semiconductor device 100 according to Example 3.

FIG. 8 illustrates one example of configuration of a semiconductor device 100 according to Example 3. Contact layers 28 of the present example are formed by implanting dopants in multiple steps. For example, the contact layers 28 are formed through three steps of implantation processes.

Interlayer dielectric films 26 function as masks while dopants are implanted in the contact layers 28. Also, the interlayer dielectric films 26 of the present example are tapered. Therefore, a thickness of an interlayer dielectric film 26 as a mask depends on a dopant implantation position for a contact layer 28. A dopant implantation depth is shallow in a region where an interlayer dielectric film 26 is formed thick. Therefore, for the contact layer 28, a dopant is implanted at a deep position near the center of a contact trench 27, and a dopant is implanted at a shallow position at an end of the contact trench 27.

Thereby, a width of a lower end of the contact layer 28 is narrower than a width of an upper end of the contact layer 28. That is, the contact layer 28 of the present example has a shape that gradually gets narrower from the upper side to the lower side. Here, if a shape of a contact layer 28 has a maximum width somewhere between the upper side and the lower side instead of the shape having the width that gradually gets narrower, there is a risk that electric fields are concentrated at an end of the contact layer 28. On the other hand, the contact layer 28 of the present example has a width formed to gradually get narrower. Thereby, in a case in which a depletion layer extends, it is difficult for electric fields to be concentrated at an end of the contact layer 28.

Figure 9:
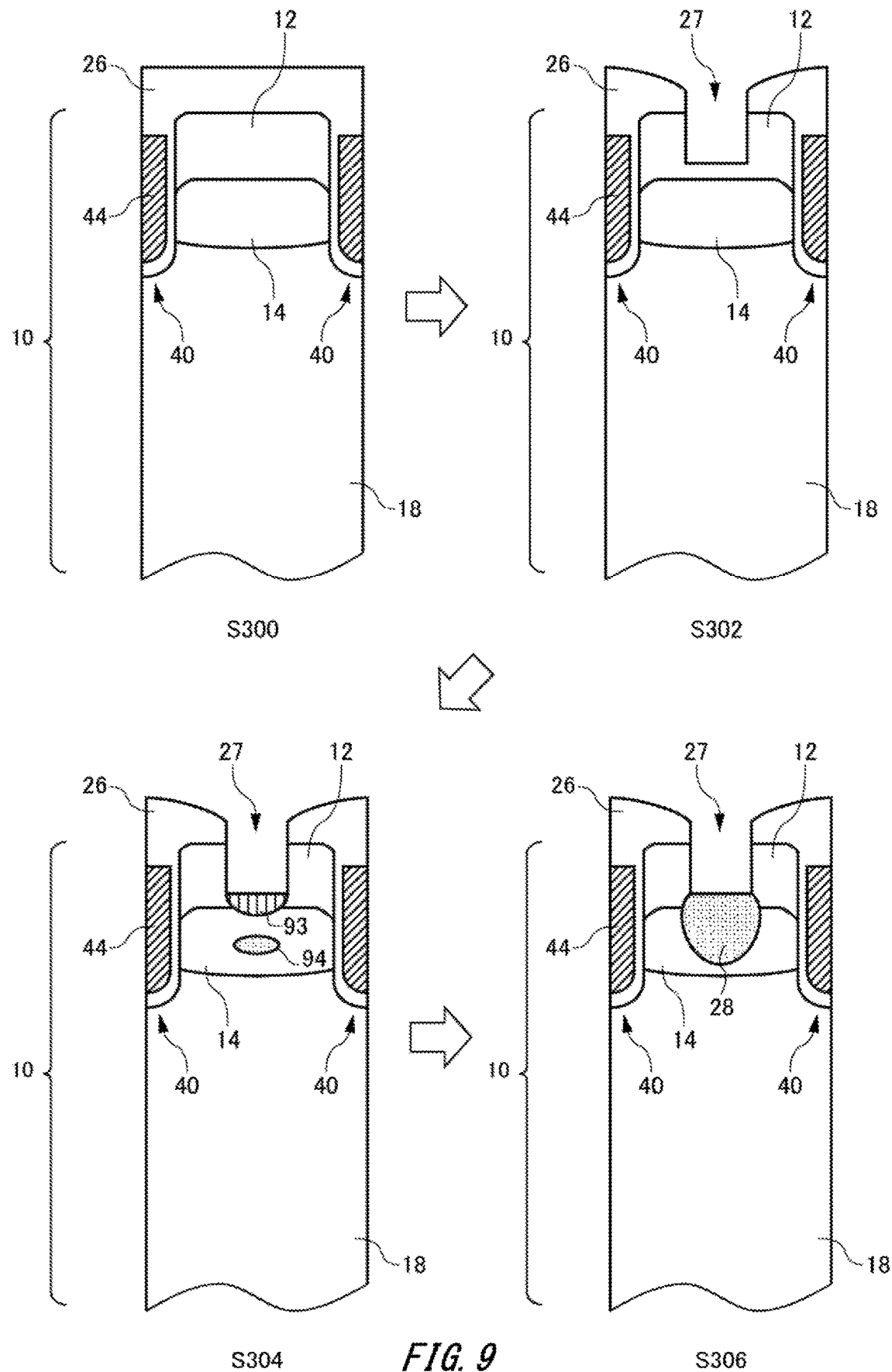
FIG. 9 illustrates one example of a manufacturing method of a semiconductor device 100.

FIG. 9 illustrates one example of a manufacturing method of a semiconductor device 100. In the present example, a manufacturing method of the semiconductor device 100 according to Example 3 is particularly described. In the drawing, a cross-sectional view of one cell is illustrated. However, other cells may be formed in the same manner.

First, a semiconductor substrate 10 is prepared. The semiconductor substrate 10 is a silicon substrate having a drift region 18. A doping concentration of the drift region 18 of the present example is from $3.0E+13$ cm$^{-3}$ to $2.0E+14$ cm$^{-3}$ inclusive, for example. A thickness of the drift region 18 depends on a withstand voltage class of the semiconductor device 100.

Next, in step S300, a source region 12, a base region 14, and gate trench portions 40 are formed on a surface of the semiconductor substrate 10. First, etching masks with predetermined patterns are provided on the surface of the semiconductor substrate 10 to form grooves of the gate trench portions 40. Gate dielectric films are formed at inner walls of the grooves of the gate trench portions 40. Then, gate conductive portions 44 are formed by depositing in the trench portions, polysilicon in which N type dopants are doped at a high concentration. Thereby, the gate trench portions 40 are formed.

Next, an oxide film is formed on the upper surface of the semiconductor substrate 10, in a region in which the base region 14 and the source region 12 are not formed. Then, a P type dopant is selectively implanted from the surface side of the semiconductor substrate 10, and approximately 2 hours of thermal treatment is conducted at a temperature of approximately 1100° C. In this manner, a P− type base region 14 is formed on the entire surface of the semiconductor substrate 10. The P type dopant may be boron. A P type dopant may be doped in the P− type base region 14 at a doping concentration of $2.5E+13$ cm$^{-2}$. The base region 14 is formed in direct contact with the gate trench portions 40, and of which regions contacting the gate trench portions 40 function as channels.

Next, as an N type dopant for forming the source region 12, arsenic, phosphorous, or the like is ion implanted from the upper surface side of the semiconductor substrate 10. The source region 12 is formed on the entire surface of the region in which the base region 14 is formed. An N type dopant may be doped in the source region 12 at a doping concentration of $5.0E+19$ cm$^{-2}$. After the ion implantation, thermal treatment or the like is conducted to form the source region 12. The source region 12 is also formed in direct contact with the gate trench portions 40. Next, an interlayer dielectric film 26 is formed on the upper surface of the semiconductor substrate 10 by CVD method.

Next, in step S302, a resist pattern is formed on the upper surface of the interlayer dielectric film 26. The interlayer dielectric film 26 exposed by an opening of the resist pattern is etched by RIE, thus the semiconductor substrate 10 is exposed. Next, the exposed upper surface of the semiconductor substrate 10 is etched to form a contact trench 27 between two trench portions, penetrating through the interlayer dielectric film 26 and being in direct contact with the source region 12. Also, the contact trench 27 is formed inside the source region 12 that is formed on the entire surface. By forming the contact trench 27 inside the source region 12, if a contact layer 28 is formed in a subsequent process, a peak of the contact layer 28 can be formed at a position shallower than the position of a lower end of the source region 12.

Next, in step S304, a P type dopant such as boron is ion implanted in an implantation region 93 that is in direct contact with a lower end of the contact trench 27. In the present example, acceleration energy of the P type dopant is approximately 30 keV, and a dosage of the P type dopant is from $1.0E+15$ cm$^{-2}$ to $5.0E+15$ cm$^{-2}$ inclusive.

Next, a dopant is implanted below the base region 14 from the lower end of the contact trench 27. For example, in order to implant a P type dopant such as boron below the base region 14, ion is perpendicularly implanted from the lower end of the contact trench 27. In this manner, the contact layer 28 is formed in a region facing the lower end of the contact trench 27 such that a peak of a doping concentration of the contact layer 28 is positioned shallower than the position of the lower end of the source region 12. Dopants may be implanted in the contact layer 28, in multiple steps. The step of forming the contact layer 28 of the present example includes a step of implanting the first dopant and a step of implanting the second dopant. For example, boron is implanted as the first dopant and boron fluoride is implanted as the second dopant. Also, in each P type dopant implantation, acceleration energy may be changed depending on the depth of the contact layer 28 to be formed. One or more implantation regions 94 are formed below the implantation region 93 by the P type dopant implantation.

Next, in step S306, the semiconductor device 100 is thermally treated to activate the P type dopants implanted in the implantation region 93 and the implantation region 94. It is preferable to conduct the thermal treatment in a short time in order to avoid excessive diffusion of the P type dopant. As one example, the temperature and the time of the thermal treatment is approximately 950 degrees Celsius and within 30 minutes, respectively.

In this manner, the contact layer 28 is formed. After the step S306, an emitter electrode 52, a collector electrode 24, and the like are formed to complete the semiconductor device 100. Note that, in order to suppress mutual diffusion between the emitter electrode 52 and the semiconductor region, it is preferable to form a barrier metal layer including a titanium film, a titanium nitride film, a tantalum film, a tantalum nitride film, or the like on an inner wall of the contact trench 27. Also, in order to improve flatness of the emitter electrode 52, the contact trench 27 may be filled with tungsten, molybdenum, polysilicon doped with a dopant, or the like before forming the emitter electrode 52.

Figure 10A:
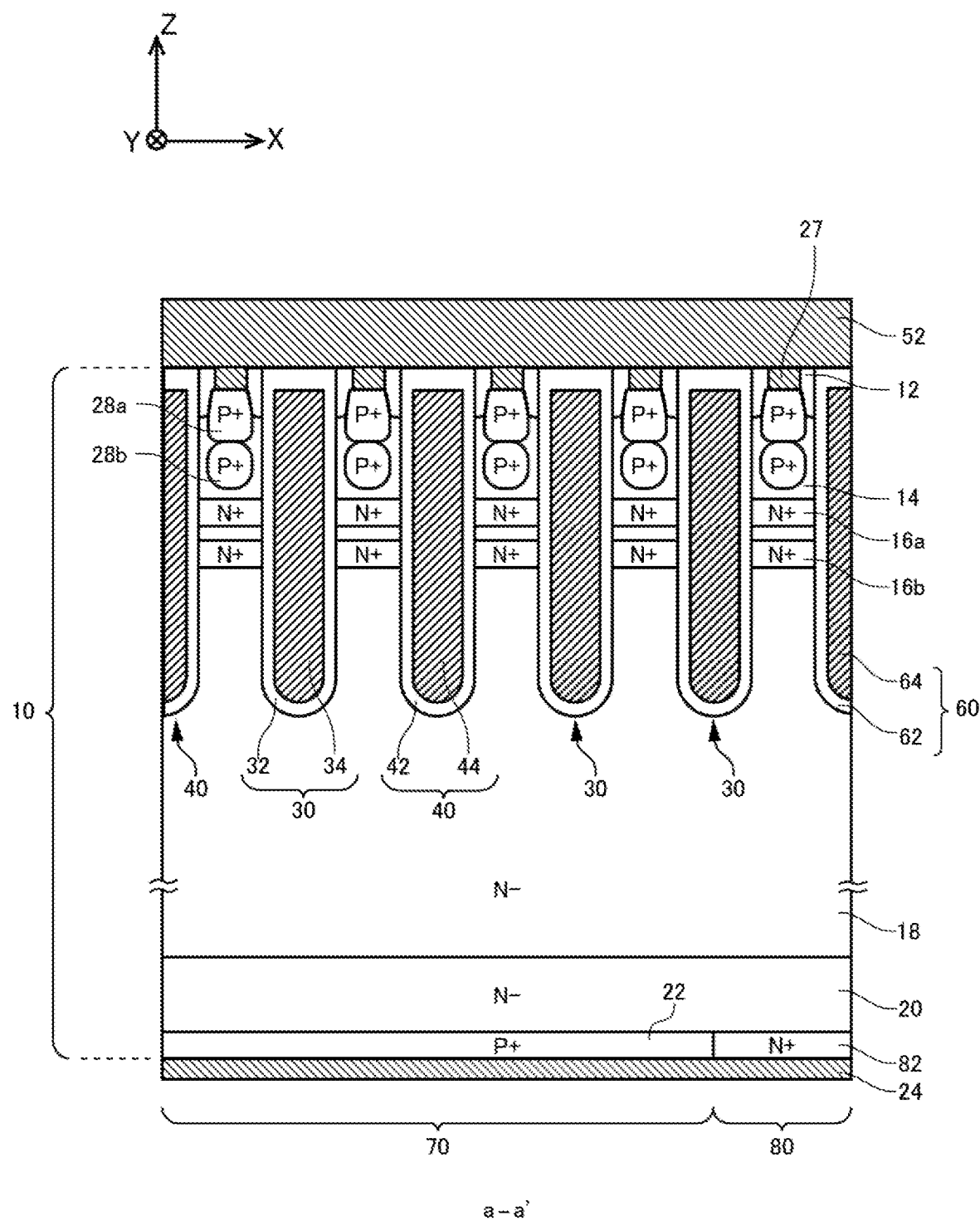
FIG. 10A illustrates one example of the cross-section a-a' of a semiconductor device 100 according to Example 4.

FIG. 10A illustrates one example of the cross-section a-a' of a semiconductor device 100 according to Example 4. A plan view of the semiconductor device 100 of the present example corresponds to the plan view of the semiconductor device 100 according to Example 1 illustrated in FIG. 1A. That is, the cross-section a-a' of the present example corresponds to the cross-section a-a' of FIG. 1A. The semiconductor device 100 of the present example includes a plurality of accumulation regions 16a and accumulation regions 16b, and a plurality of contact layers 28a and contact layers 28b.

Accumulation regions 16a and accumulation regions 16b are provided in at least one of a transistor portion 70 and a diode portion 80. The accumulation regions 16a and the accumulation regions 16b of the present example are provided in both of a transistor portion 70 and a diode portion 80. An accumulation region 16a and an accumulation region 16b are examples of accumulation regions 16 having depths different from each other. Accumulation regions 16a are formed at positions shallower than positions of accumulation regions 16b. Doping concentrations of the accumulation regions 16a and the accumulation regions 16b may be the same. Note that, an accumulation region 16a is one example of the first accumulation region. An accumulation region 16b is one example of the second accumulation region.

Contact layers 28a and contact layers 28b are provided in at least one of a transistor portion 70 and a diode portion 80. The contact layers 28a and the contact layers 28b of the present example are provided in both of a transistor portion 70 and a diode portion 80.

The contact layers 28a and the contact layers 28b are provided below contact trenches 27. Also, the contact layers 28b are provided below the contact layers 28a. The contact layers 28a and the contact layers 28b are of P+ types. The doping concentrations of the contact layers 28b may be the same as the doping concentrations of the contact layers 28a. Also, dopants of the contact layers 28b may be the same as dopants of the contact layers 28a.

The structure of the contact layers 28 described in another Example may be appropriately applied to the contact layers 28a of the present example. For example, each contact layer 28a may have a plurality of peaks in a doping concentration. Similarly, the contact layers 28b may have a plurality of peaks of a doping concentration. Note that, a contact layer 28a is one example of the first contact layer, and a contact layer 28b is one example of the second contact layer.

Because the semiconductor device 100 of the present example has a plurality of contact layers 28, holes are likely to be extracted. Thereby, it is possible to improve latch-up withstand capability. Specifically, the plurality of contact layers 28 can suppress latch-ups even if carrier density rises because of the plurality of accumulation regions 16. Also, because the semiconductor device 100 has the plurality of accumulation regions 16, it is possible to reduce turn-on loss as well as to improve trade-off between the ON voltage and turn-off loss.

Figure 10B:
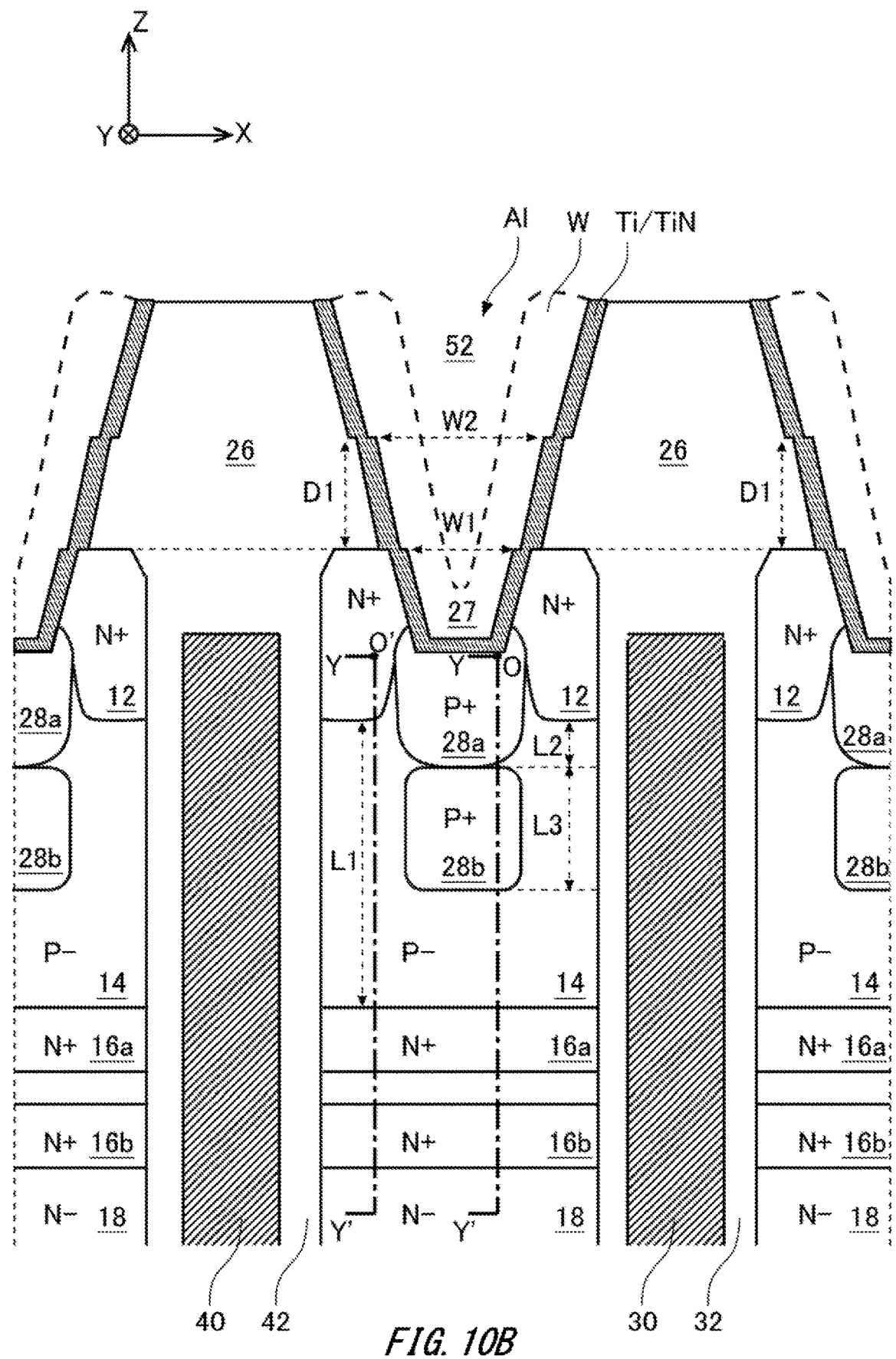
FIG. 10B illustrates a more concrete example of a structure of the semiconductor device 100 according to Example 4.

FIG. 10B illustrates a more concrete example of a structure of the semiconductor device 100 according to Example 4. The semiconductor device 100 of the present example is different from the embodiment shown in FIG. 4 in that it has the accumulation regions 16b and the contact layers 28b. A distance L1, a distance L2, an opening width W1, an opening width W2, and a depth D1 may be defined under the same condition as the condition for those in the embodiment shown in FIG. 4.

A distance L3 represents a distance between an upper end of a contact layer 28b and a lower end of a contact layer 28b in a depth direction. That is, the distance L3 corresponds to the thickness of the contact layer 28b. Here, the lower end of the contact layer 28b may be formed in direct contact with an accumulation region 16a. In this case, L1=L2+L3.

Also, the lower end of the contact layer 28b may be provided at a position deeper than half the distance between an upper end of the accumulation region 16a and a lower end of a source region 12. In this case, L1/2<L2+L3.

A width of a contact layer 28b may be substantially the same as a width of a contact layer 28a. In this case, the contact layer 28b is formed in the same manner as forming the contact layer 28a, which is implanting a dopant via a contact trench 27.

Figure 10C:
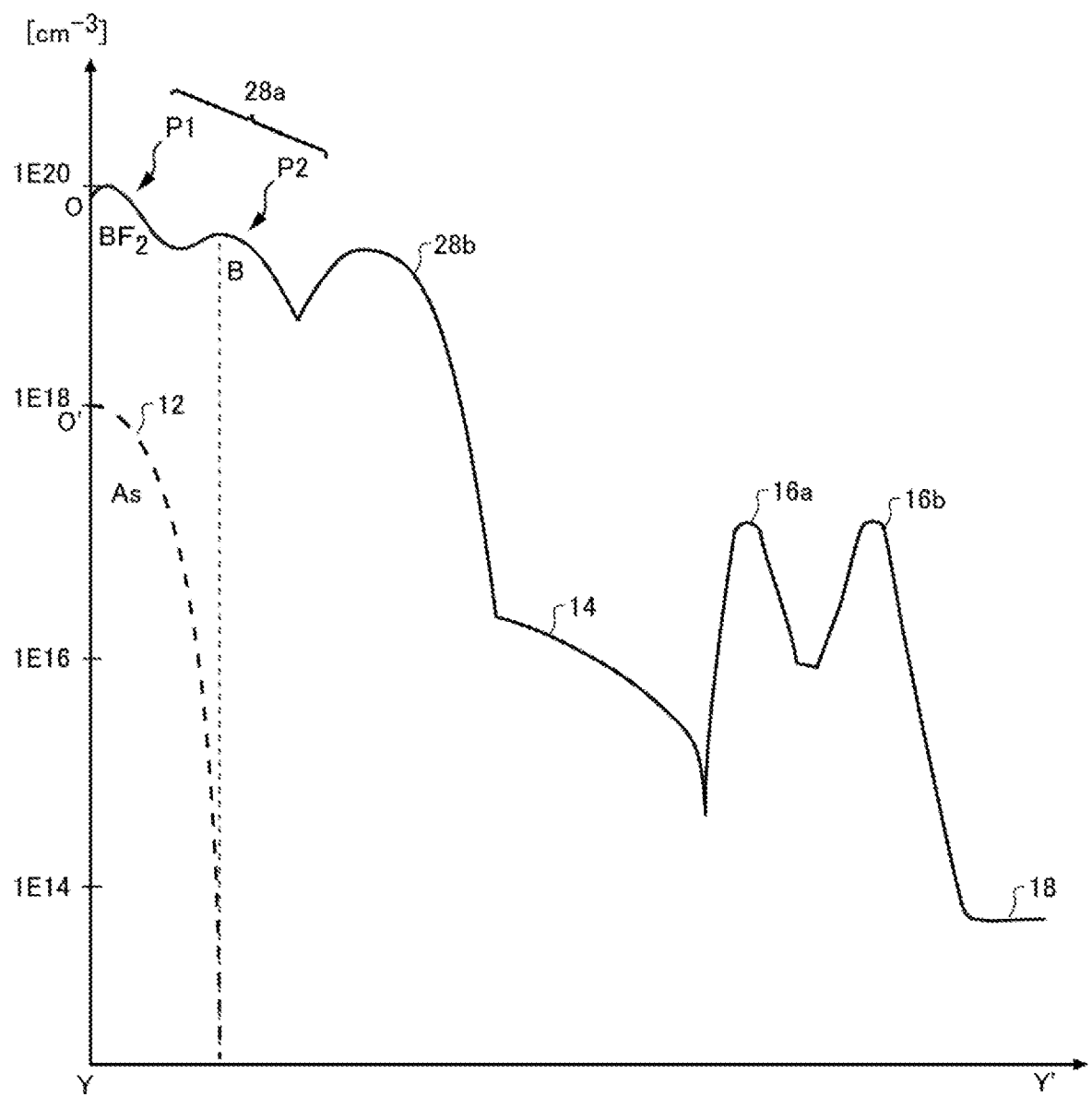
FIG. 10C illustrates examples of doping concentration distributions in the cross-sections Y-Y' in the vicinity of contact layers 28 in FIG. 10B.

FIG. 10C illustrates examples of doping concentration distributions in the cross-sections Y-Y' in the vicinity of contact layers 28 in FIG. 10B. The vertical axis represents the doping concentration, and the horizontal axis represents the distance in the depth direction from the lower end of the contact trench 27. The solid line represents doping concentrations of the contact layer 28 and a base region 14 observed in the depth direction from the point O. The dashed line represents the doping concentration of the source region 12 observed in the depth direction from the point O'. That is, the graph of the doping concentration distributions of the present example displays doping concentrations in the depth directions from two different points O and O' respectively, in an overlapping manner. Note that, the point O and the point O' represent origins of the graph of the doping concentrations illustrated in FIG. 10B, respectively. The depth of the point O and the depth of the point O' correspond to a depth of the lower end of the contact trench 27.

The source region 12 is formed by ion implanting arsenic (As) from an upper surface side of the base region 14. The doping concentration of the source region 12 is approximately $1E18$ $cm^{-3}$ at the point O' of the lower end of the contact trench 27.

The contact layer 28 is formed by ion implanting boron fluoride and boron over the contact trench 27 in two steps. The first peak P1 of the contact layer 28 is approximately $1E20$ $cm^{-3}$. The first peak P1 of the contact layer 28 is formed at a position shallower than a position of the lower end of the source region 12. The second peak P2 of the present example is formed at a position deeper than the position of the lower end of the source region 12. However, the second peak P2 may be formed at a position shallower than the position of the lower end of the source region 12.

Both of the contact layer 28a and the contact layer 28b may be formed at positions shallower than the position of the lower end of the source region 12, or any one of the contact layer 28a and the contact layer 28b may be formed at a position deeper than the position of the lower end of the source region 12. That is, it is sufficient if at least any one of the contact layer 28a and the contact layer 28b is formed at a position shallower than the position of the lower end of the source region 12. Also, among the peaks of the doping concentration of the contact layer 28a and the contact layer 28b, the maximum peak may be formed at a position shallower than the position of the lower end of the source region 12.

Furthermore, in the present example, the accumulation region 16 has two peaks (the accumulation region 16a and the accumulation region 16b) of a doping concentration. A doping concentration between the two peaks may be in a valley-shaped N type concentration region having a concentration higher than a concentration of a drift region 18. Alternatively, it may be in a valley-shaped concentration region having substantially the same concentration as the concentration of the drift region 18.

Note that, the distributions of the doping concentrations of the present example are merely one example. To realize the semiconductor device 100 disclosed in the present specification, the number of the peaks, the depth, or the like may be changed appropriately.

Figure 11A:
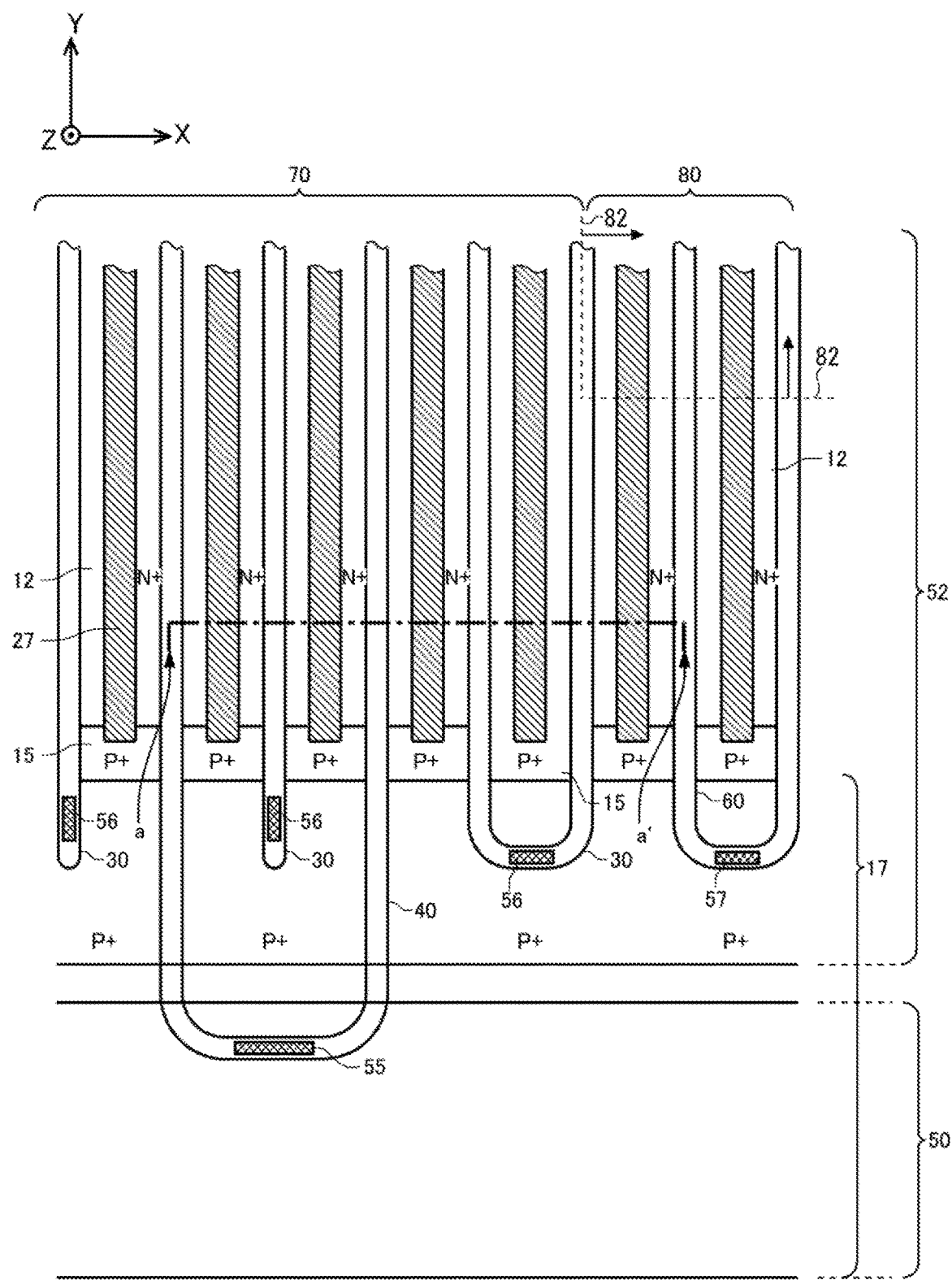
FIG. 11A is a plan view illustrating one example of a semiconductor device 100 according to Example 5.

FIG. 11A is a plan view illustrating one example of a semiconductor device 100 according to Example 5. Arrangement of contact trenches 27 in the semiconductor device 100 of the present example is different from that of the semiconductor device 100 according to Example 1.

Y axis direction ends of the contact trenches 27 of the present example are provided inside contact regions 15 in the plan view. That is, the contact trenches 27 are provided extending inside the contact regions 15 from source regions 12 in the plan view. Also, the Y axis direction ends of contact trenches 27 may be provided in direct contact with contact regions 15. The contact trenches 27 of the present example can easily extract external carriers at the Y axis direction ends. Thereby, turn-off withstand capability and reverse recovery withstand capability of the semiconductor device 100 improve.

Also, a transistor portion 70 of the present example has a mesa portion provided on the side closest to a diode portion 80, in which a source region 12 is not formed on the front surface of a semiconductor substrate 10. However, the transistor portion 70 may have a mesa portion provided on the side closest to a diode portion 80, in which a source region 12 is formed.

Figure 11B:
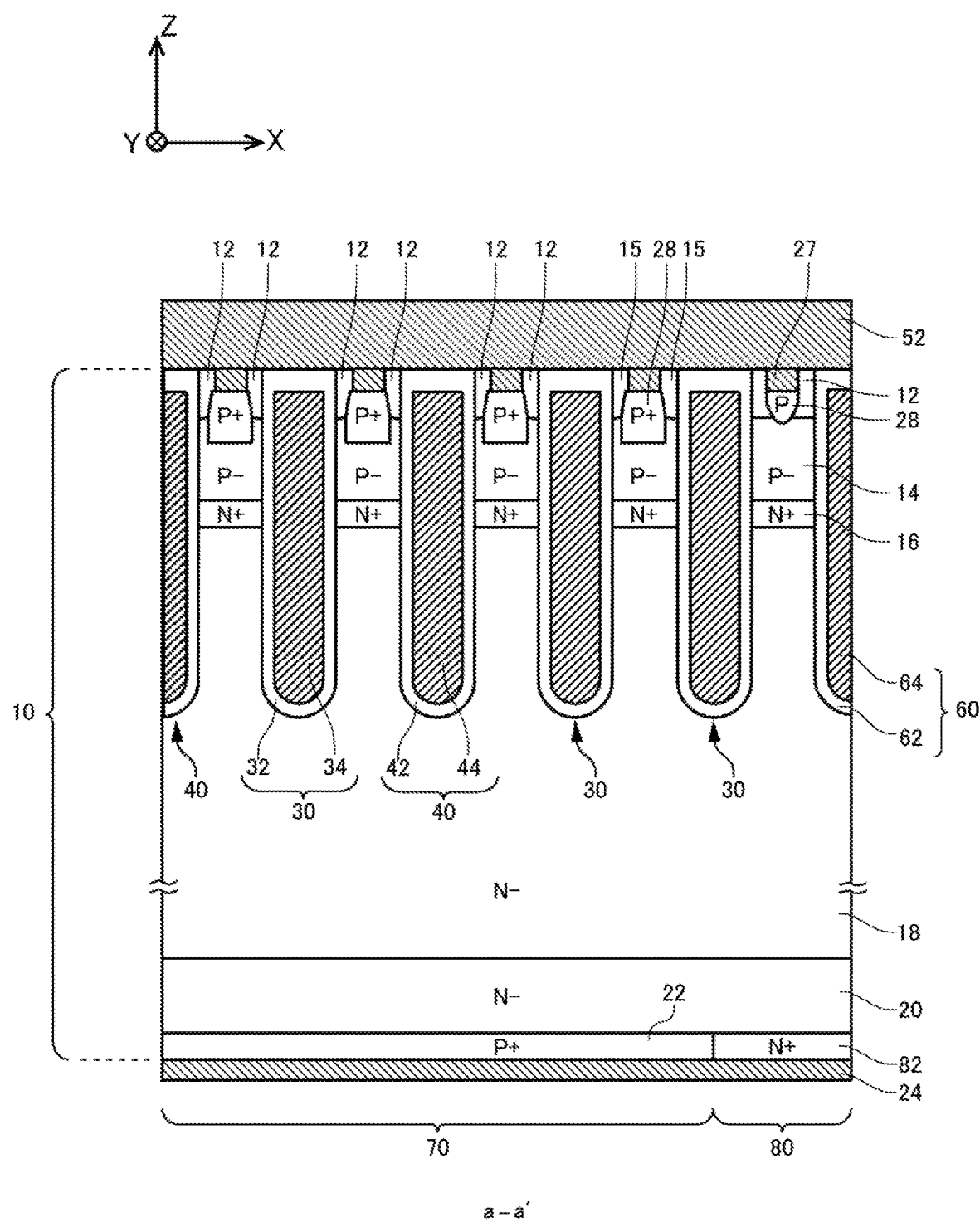
FIG. 11B illustrates one example of the cross-section a-a' of the semiconductor device 100 according to Example 5.

FIG. 11B illustrates one example of the cross-section a-a' of the semiconductor device 100 according to Example 5. Arrangement method of contact layers 28 in the semiconductor device 100 of the present example is different from that of the semiconductor device 100 according to Example 1. In the semiconductor device 100 of the present example, arrangement of contact layers 28 in the transistor portion 70 varies from arrangement of contact layers 28 in the diode portion 80.

For example, the semiconductor device 100 of the present example has the transistor portion 70 and the diode portion 80 that are provided with contact layers 28. The contact layers 28 of the diode portion 80 may be formed at positions shallower than positions of the contact layers 28 of the transistor portion 70, and may have doping concentrations lower than doping concentrations of the contact layers 28 of the transistor portion 70. In this case, in the diode portion 80, the first peak P1 of a contact layer 28 and a base region 14 may be in direct contact with the bottom surface of a contact trench 27. Thereby, it is possible to suppress excessive holes from being implanted from the contact regions 15.

Figure 12A:
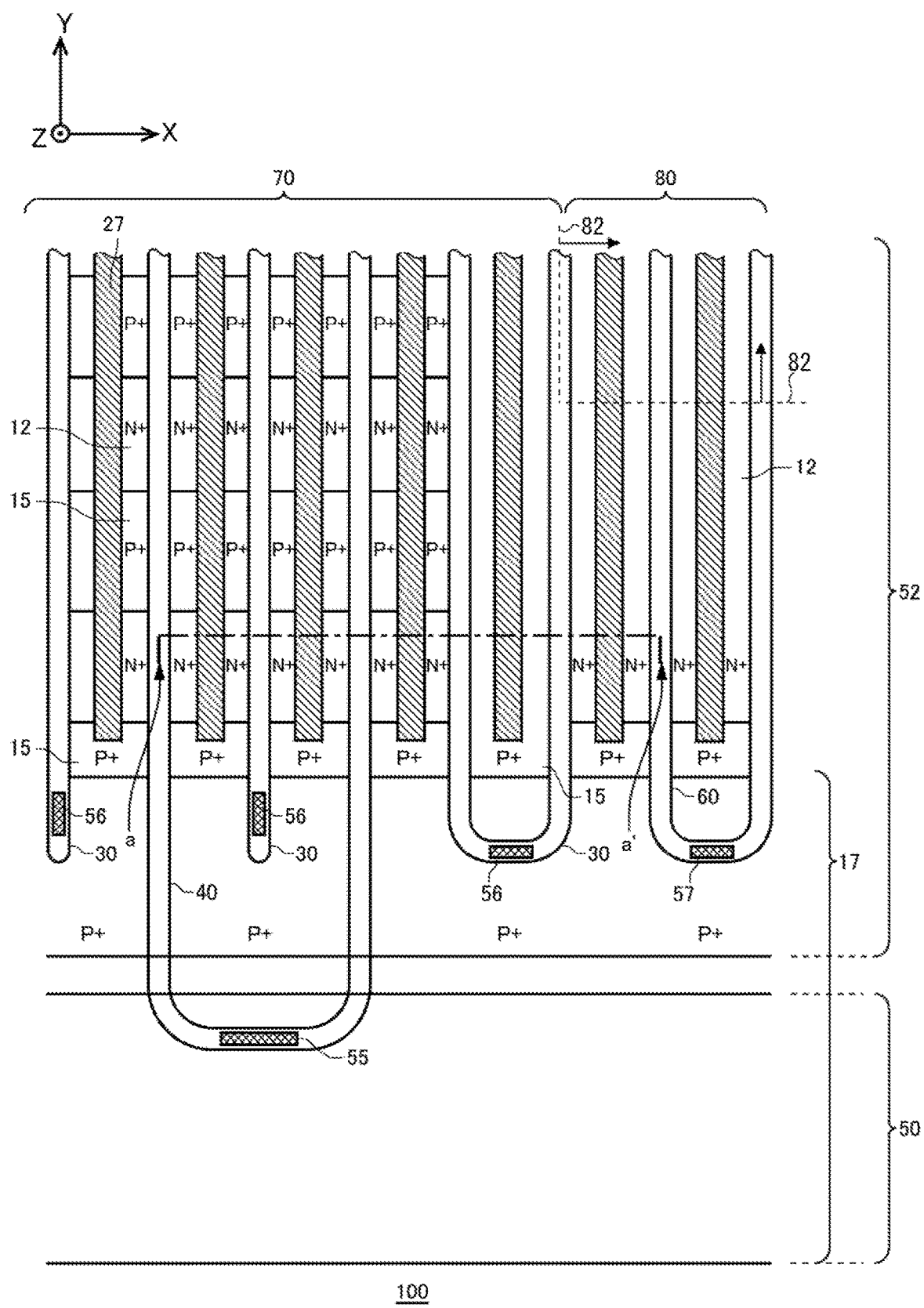
FIG. 12A is a plan view illustrating one example of a semiconductor device 100 according to Example 6.

FIG. 12A is a plan view illustrating one example of a semiconductor device 100 according to Example 6. Arrangement of contact trenches 27 in the semiconductor device 100 of the present example is different from that of the semiconductor device 100 according to Example 2.

Y axis direction ends of the contact trenches 27 of the present example are provided inside contact regions 15 in the plan view. That is, the contact trenches 27 are provided extending inside the contact regions 15 from source regions 12 in the plan view. Also, the Y axis direction ends of contact trenches 27 may be provided in direct contact with contact regions 15. The contact trenches 27 of the present example can easily extract external carriers at the Y axis direction ends. Thereby, turn-off withstand capability and reverse recovery withstand capability of the semiconductor device 100 improve.

Also, a transistor portion 70 of the present example has a mesa portion provided on the side closest to a diode portion 80, in which a source region 12 is not formed on the front surface of a semiconductor substrate 10. However, the transistor portion 70 may have a mesa portion provided on the side closest to a diode portion 80, in which a source region 12 is formed.

Figure 12B:
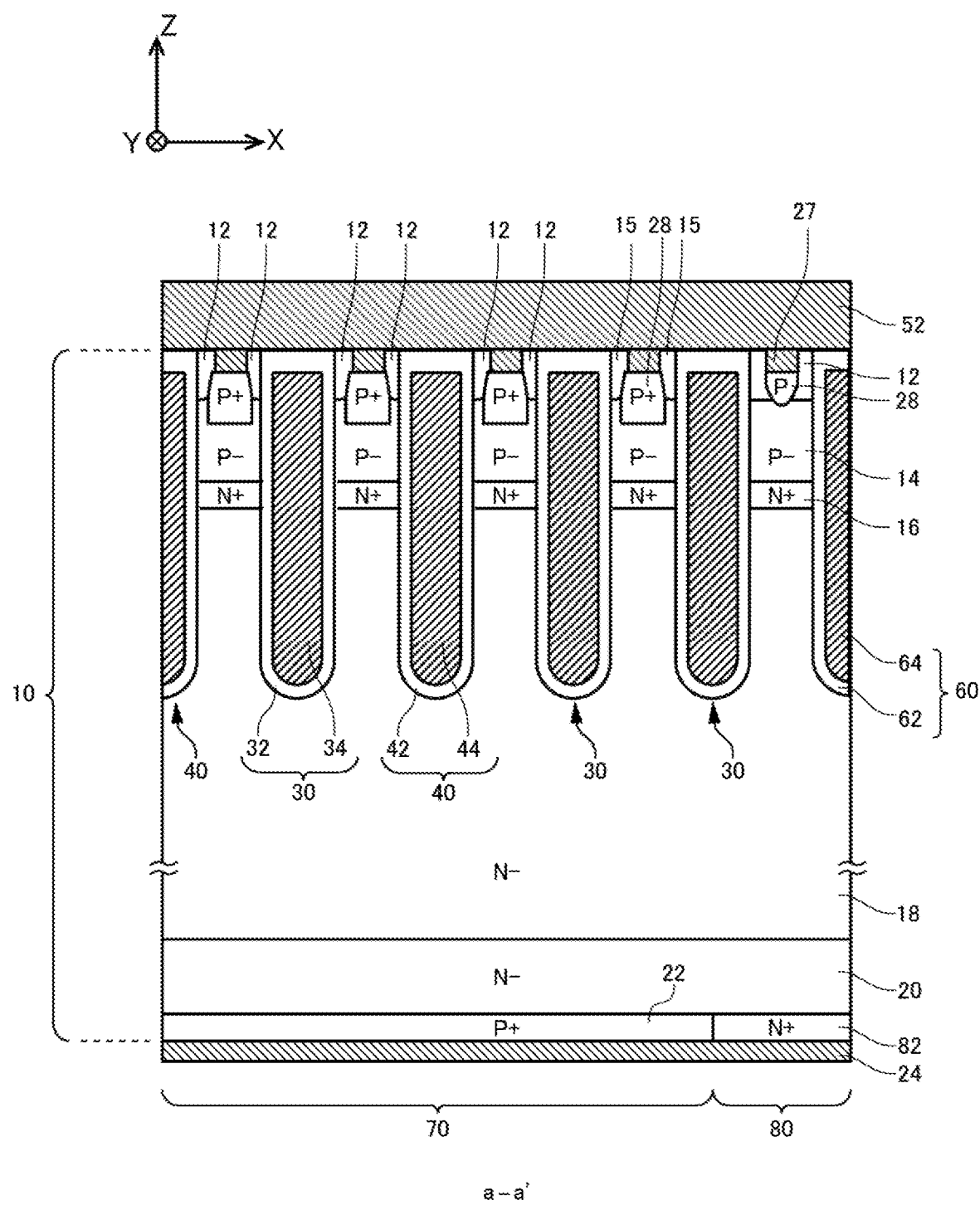
FIG. 12B illustrates one example of the cross-section a-a' of the semiconductor device 100 according to Example 6.

FIG. 12B illustrates one example of the cross-section a-a' of the semiconductor device 100 according to Example 6. Arrangement method of contact layers 28 in the semiconductor device 100 of the present example is different from that of the semiconductor device 100 according to Example 2. In the semiconductor device 100 of the present example, arrangement of contact layers 28 in the transistor portion 70 varies from arrangement of contact layers 28 in the diode portion 80.

For example, the semiconductor device 100 of the present example has the transistor portion 70 and the diode portion 80 that are provided with contact layers 28. The contact layers 28 of the diode portion 80 may be formed at positions shallower than positions of the contact layers 28 of the transistor portion 70, and may have doping concentrations lower than doping concentrations of the contact layers 28 of the transistor portion 70. In this case, in the diode portion 80, the first peak P1 of a contact layer 28 and a base region 14 may be in direct contact with the bottom surface of a contact trench 27. Thereby, it is possible to suppress excessive holes from being implanted from the contact regions 15.

While the embodiments of the present invention have been described, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, stages, or the like of each process performed by an apparatus and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a semiconductor substrate;
   a drift region of a first conductivity type provided on an upper surface side of the semiconductor substrate;
   a base region of a second conductivity type provided above the drift region;
   a source region of a first conductivity type provided above the base region;
   two or more trench portions provided penetrating through the source region and the base region from an upper end side of the source region;
   a contact trench provided in direct contact with the source region between adjacent trench portions;
   a first contact layer of a second conductivity type provided below the contact trench, wherein
      a peak of a doping concentration of the first contact layer is positioned shallower than a position of a lower end of the source region, and
      a lower end of the first contact layer is positioned deeper than the position of the lower end of the source region; and
   a contact region of a second conductivity type provided above the base region, wherein
      the source region and the contact region are alternately provided in an extending direction of the trench portions.

2. A semiconductor device comprising:
   a semiconductor substrate;
   a drift region of a first conductivity type provided on an upper surface side of the semiconductor substrate;
   a base region of a second conductivity type provided above the drift region;
   a source region of a first conductivity type provided above the base region;
   two or more trench portions provided penetrating through the source region and the base region from an upper end side of the source region;
   a contact trench provided in direct contact with the source region between adjacent trench portions; and
   a first contact layer of a second conductivity type provided below the contact trench, wherein
      a peak of a doping concentration of the first contact layer is positioned shallower than a position of a lower end of the source region, and
      a lower end of the first contact layer is positioned deeper than the position of the lower end of the source region;
   wherein the doping concentration of the first contact layer is larger than a doping concentration of the source region at a same depth below the contact trench.

3. The semiconductor device according to claim 2, wherein the first contact layer has a plurality of peaks of a doping concentration.

4. The semiconductor device according to claim 3, wherein the peak position is a peak position of a peak having a maximum doping concentration among the plurality of peaks.

5. The semiconductor device according to claim 2, wherein the lower end of the source region is positioned deeper than a position of a lower end of the contact trench.

6. The semiconductor device according to claim 2, wherein
   each of the two or more trench portions have a trench conductive portion, and
   the lower end of the source region is positioned deeper than a position of an upper end of the trench conductive portion.

7. The semiconductor device according to claim 2, wherein the lower end of the source region has a width from 10% to 30% inclusive of a mesa width between the two or more trench portions, in an arrangement direction of the trench portions.

8. The semiconductor device according to claim 2, wherein the source region is provided extending in an extending direction of the trench portions.

9. The semiconductor device according to claim 2, wherein the first contact layer is provided extending in an extending direction of the two or more trench portions.

10. The semiconductor device according to claim 2, wherein the first contact layer is provided at least a part of a side wall of the contact trench.

11. The semiconductor device according to claim 2, wherein a thickness of the first contact layer in a depth direction is from 0.1 μm to 1.0 μm inclusive.

12. The semiconductor device according to claim 2, wherein the lower end of the first contact layer is positioned shallower than a position half a thickness of the base region.

13. The semiconductor device according to claim 2, wherein the lower end of the first contact layer is at a position as deep as a position of a lower end of the base region.

14. The semiconductor device according to claim 2, wherein an upper end of the first contact layer is positioned shallower than a position of the lower end of the source region.

15. The semiconductor device according to claim 2, wherein a width of the lower end of the first contact layer is narrower than a width of an upper end of the first contact layer in an arrangement direction of the trench portions.

16. The semiconductor device according to claim 2, wherein a lower end of the contact trench has a width from 0.1 μm to 0.4 μm inclusive, in an arrangement direction of the trench portions.

17. The semiconductor device according to claim 2, wherein the contact trench is tapered.

18. The semiconductor device according to claim 2, further comprising:
   a first accumulation region of a first conductivity type provided between the drift region and the base region, wherein
      the first accumulation region has a concentration higher than a concentration of the drift region.

19. The semiconductor device according to claim 18, wherein the first contact layer is in direct contact with the first accumulation region.

20. The semiconductor device according to claim 18, wherein the lower end of the first contact layer is provided at a position deeper than half a distance between an upper end of the first accumulation region and the lower end of the source region.

21. The semiconductor device according to claim 18, further comprising:
   a second accumulation region of a first conductivity type formed at a position deeper than a position of the first accumulation region, wherein
      the second accumulation region has a doping concentration higher than a doping concentration of the drift region.

22. A semiconductor device comprising:
a semiconductor substrate;
a drift region of a first conductivity type provided on an upper surface side of the semiconductor substrate;
a base region of a second conductivity type provided above the drift region;
a source region of a first conductivity type provided above the base region;
two or more trench portions provided penetrating through the source region and the base region from an upper end side of the source region;
a contact trench provided in direct contact with the source region between adjacent trench portions; and
a first contact layer of a second conductivity type provided below the contact trench, wherein
  a peak of a doping concentration of the first contact layer is positioned shallower than a position of a lower end of the source region, and
  a lower end of the first contact layer is positioned deeper than the position of the lower end of the source region; and
a second contact layer of a second conductivity type provided below the first contact layer.

23. A manufacturing method of a semiconductor device comprising:
  forming a drift region of a first conductivity type, a base region of a second conductivity type, a source region of a first conductivity type, two or more trench portions penetrating through the source region and the base region, on an upper surface side of a semiconductor substrate;
  forming a contact trench between two trench portions so as to be in direct contact with the source region; and
  forming a contact layer of a second conductivity type by implanting dopants below the base region from a lower end of the contact trench, such that a peak of a doping concentration is positioned shallower than a position of a lower end of the source region, in a region facing the lower end of the contact trench, wherein
    a lower end of the contact layer is positioned deeper than the position of the lower end of the source region;
  wherein the doping concentration of the first contact layer is larger than a doping concentration of the source region at a same depth below the contact trench.

24. The manufacturing method of the semiconductor device according to claim 23, wherein the forming the contact layer includes implanting a first dopant and implanting a second dopant.

25. The manufacturing method of the semiconductor device according to claim 23, wherein
  the forming the source region includes forming the source region in an entire surface of the base region, and
  the forming the contact trench includes forming the contact trench between the two trench portions inside the source region formed in the entire surface of the base region.

* * * * *